(12) United States Patent
Na et al.

(10) Patent No.: US 12,237,210 B2
(45) Date of Patent: Feb. 25, 2025

(54) SEMICONDUCTOR DEVICE

(71) Applicant: SAMSUNG ELECTRONICS CO., LTD., Suwon-si (KR)

(72) Inventors: Chae Ho Na, Changwon-si (KR); Sung Soo Kim, Hwaseong-si (KR); Gyu Hwan Ahn, Gunpo-si (KR); Dong Hyun Roh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 424 days.

(21) Appl. No.: 17/740,095

(22) Filed: May 9, 2022

(65) Prior Publication Data

US 2022/0262673 A1    Aug. 18, 2022

Related U.S. Application Data

(63) Continuation of application No. 16/831,500, filed on Mar. 26, 2020, now Pat. No. 11,328,949.

(30) Foreign Application Priority Data

Apr. 8, 2019    (KR) .................... 10-2019-0040756
Sep. 4, 2019    (KR) .................... 10-2019-0109469

(51) Int. Cl.
*H01L 21/762*    (2006.01)
*H01L 27/088*    (2006.01)
(Continued)

(52) U.S. Cl.
CPC .... *H01L 21/76229* (2013.01); *H01L 27/0886* (2013.01); *H01L 29/0649* (2013.01);
(Continued)

(58) Field of Classification Search
CPC .......... H01L 21/76229; H01L 27/0886; H01L 29/0649; H01L 29/7851; H01L 29/7856; H01L 29/78696

See application file for complete search history.

(56) References Cited

U.S. PATENT DOCUMENTS 6,808,748 B2    10/2004    Kapoor et al.
6,893,937 B1     5/2005    Gu et al.
(Continued)

OTHER PUBLICATIONS

Office Action dated Aug. 19, 2021 in corresponding U.S. Appl. No. 16/831,500.
(Continued)

*Primary Examiner* — Christine A Enad
(74) *Attorney, Agent, or Firm* — F. Chau & Associates, LLC

(57) ABSTRACT

A semiconductor device includes a substrate, a first fin, and a second fin. The first and second fins are spaced apart from each other in a first direction on the substrate and extend in a second direction intersecting the first direction. The semiconductor device further includes a first shallow trench formed between the first and second fins, and a field insulating film which fills at least a part of the first shallow trench. The field insulating film includes a first portion, a second portion adjacent to the first portion, and a third portion adjacent to the second portion and adjacent to a side wall of the first shallow trench. The first portion includes a central portion of an upper surface of the field insulating film in the first direction. The upper surface of the field insulating film is in a shape of a brace recessed toward the substrate.

18 Claims, 39 Drawing Sheets

(51) Int. Cl.
*H01L 29/06* (2006.01)
*H01L 29/78* (2006.01)
*H01L 29/786* (2006.01)

(52) U.S. Cl.
CPC ...... *H01L 29/7851* (2013.01); *H01L 29/7856* (2013.01); *H01L 29/78696* (2013.01)

(56) References Cited

U.S. PATENT DOCUMENTS

| | | |
|---|---|---|
| 7,344,953 B2 | 3/2008 | Hecht et al. |
| 8,592,005 B2 | 11/2013 | Ueda |
| 9,425,078 B2 | 8/2016 | Tang et al. |
| 9,611,544 B2 | 4/2017 | La Voie et al. |
| 9,966,299 B2 | 5/2018 | Tang et al. |
| 2002/0027245 A1 | 3/2002 | Noguchi |
| 2004/0072408 A1 | 4/2004 | Yun et al. |
| 2005/0221578 A1 | 10/2005 | Kamo et al. |
| 2006/0240187 A1 | 10/2006 | Denysyk et al. |
| 2008/0119020 A1 | 5/2008 | Grisham et al. |
| 2011/0097889 A1 | 4/2011 | Yuan et al. |
| 2014/0065795 A1 | 3/2014 | Lin et al. |
| 2015/0243545 A1 | 8/2015 | Tang et al. |
| 2015/0270264 A1 | 9/2015 | Basker et al. |
| 2015/0303118 A1 | 10/2015 | Wang et al. |
| 2016/0163837 A1 | 6/2016 | Wu et al. |
| 2017/0062613 A1* | 3/2017 | Sung .................. H01L 29/0653 |
| 2017/0077095 A1* | 3/2017 | Lu ..................... H01L 21/31111 |
| 2017/0317084 A1 | 11/2017 | Cantoro et al. |
| 2018/0308701 A1 | 10/2018 | Na et al. |
| 2020/0075399 A1 | 3/2020 | Kim et al. |
| 2020/0321241 A1 | 10/2020 | Na et al. |

OTHER PUBLICATIONS

Notice Of Allowance dated Jan. 4, 2022 in corresponding U.S. Appl. No. 16/831,500.

* cited by examiner

SEMICONDUCTOR DEVICE

CROSS-REFERENCE TO RELATED APPLICATIONS

This application is a continuation of U.S. patent application Ser. No. 16/831,500 filed Mar. 26, 2020, which claims priority under 35 U.S.C. § 119 to Korean Patent Application No. 10-2019-0040756, filed on Apr. 8, 2019, and Korean Patent Application No. 10-2019-0109469, filed on Sep. 4, 2019, in the Korean Intellectual Property Office, the disclosures of which are incorporated by reference herein in their entireties.

TECHNICAL FIELD

Exemplary embodiments of the present inventive concept relate to a semiconductor device, and more particularly, to a semiconductor device including a shallow trench isolation (STI) region filled using an atomic layer deposition (ALD) method.

DISCUSSION OF THE RELATED ART

A semiconductor device may include an integrated circuit including a plurality of metal oxide semiconductor field effect transistors (MOSFETs). As the size and the design rule of such a semiconductor device are gradually reduced, the MOSFETs are scaled down. This scaling down may cause a short channel effect, which may degrade the operating characteristics of the semiconductor device. Thus, various methods for forming a semiconductor device having excellent performance characteristics, high reliability and low power consumption are being studied, while overcoming the limitations associated with the high integration level of the semiconductor device.

SUMMARY

Aspects of the present inventive concept provide a semiconductor device with improved operating characteristics.

Aspects of the present inventive concept also provide a semiconductor device in which a manufacturing process is simplified.

According to exemplary embodiments of the present inventive concept, a semiconductor device includes a substrate, a first fin, and a second fin. The first and second fins are spaced apart from each other in a first direction on the substrate and extend in a second direction intersecting the first direction. The semiconductor device further includes a first shallow trench formed between the first and second fins, and a field insulating film which fills at least a part of the first shallow trench. The field insulating film includes a first portion, a second portion adjacent to the first portion, and a third portion adjacent to the second portion and adjacent to a side wall of the first shallow trench. The first portion includes a central portion of an upper surface of the field insulating film in the first direction. The upper surface of the field insulating film is in a shape of a brace recessed toward the substrate.

According to exemplary embodiments of the present inventive concept, a semiconductor device includes a substrate, a first fin, and a second fin. The first and second fins are spaced apart from each other in a first direction on the substrate and extend in a second direction intersecting the first direction. The semiconductor device further includes a first shallow trench formed between the first and second fins, and a field insulating film which fills at least a part of the first shallow trench. An upper surface of the field insulating film includes a first portion, a second portion and a third portion sequentially located from a center of the shallow trench in the first direction. A first slope formed by the first portion with the first direction is greater than a second slope formed by the second portion with the first direction, and a third slope formed by the third portion with the first direction is greater than the second slope. Signs of the first, second and third slopes are the same.

According to exemplary embodiments of the present inventive concept, a semiconductor device includes a substrate, a first fin, and a second fin. The first and second fins are spaced apart from each other in a first direction on the substrate and extend in a second direction intersecting the first direction. The semiconductor device further includes a shallow trench formed between the first and second fins, and a field insulating film which fills at least a part of the shallow trench. An upper surface of the field insulating film is in a shape having an inflection point.

According to exemplary embodiments of the present inventive concept, a semiconductor device includes a substrate, a first shallow trench disposed in a first region of the substrate, a first lower pattern disposed in the first region of the substrate and extending in a first direction, and a second lower pattern disposed in the first region of the substrate and extending in the first direction. The first and second lower patterns are separated by the first shallow trench, and the first shallow trench has a first width in a second direction. The semiconductor device further includes a second shallow trench disposed in a second region of the substrate, a third lower pattern disposed in the second region of the substrate and extending in a third direction, and a fourth lower pattern disposed in the second region of the substrate and extending in the third direction. The third and fourth lower patterns are separated by the second shallow trench, and the second shallow trench has a second width in a fourth direction which is greater than the first width. The semiconductor device further includes a first field insulating film which fills at least a part of the first shallow trench, and a second field insulating film which fills at least a part of the second shallow trench. An upper surface of the first field insulating film includes a first portion adjacent to the first lower pattern, and a second portion adjacent to the second lower pattern. A slope of the first portion of the upper surface of the first field insulating film decreases as it extends away from the first lower pattern. A slope of the second portion of the upper surface of the first field insulating film decreases as it extends away from the second lower pattern. An upper surface of the second field insulating film includes a third portion, and a fourth portion and a fifth portion disposed on both sides of the third portion. A slope of the third portion of the upper surface of the second field insulating film is constant. A slope of the fourth portion of the upper surface of the second field insulating film decreases as it extends away from the third lower pattern. A slope of the fifth portion of the upper surface of the second field insulating film decreases as it extends away from the fourth lower pattern.

According to exemplary embodiments of the present inventive concept, a semiconductor device includes a substrate, a first shallow trench disposed in a first region of the substrate, a first lower pattern disposed in the first region of the substrate and extending in a first direction, and a second lower pattern disposed in the first region of the substrate and extending in the first direction. The first and second lower patterns are separated by the first shallow trench, and the first shallow trench has a first width in a second direction.

The semiconductor device further includes a second shallow trench disposed in a second region of the substrate, a third lower pattern disposed in the second region of the substrate and extending in a third direction, and a fourth lower pattern disposed in the second region of the substrate and extending in the third direction. The third and fourth lower patterns are separated by the second shallow trench, and the second shallow trench has a second width in a fourth direction which is smaller than the first width. The semiconductor device further includes a first field insulating film which fills at least a part of the first shallow trench, and a second field insulating film which fills at least a part of the second shallow trench. The first field insulating film includes at least one or more separation layers disposed in the first field insulating film and extending alongside an upper surface of the substrate.

BRIEF DESCRIPTION OF THE DRAWINGS

The above and other aspects and features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
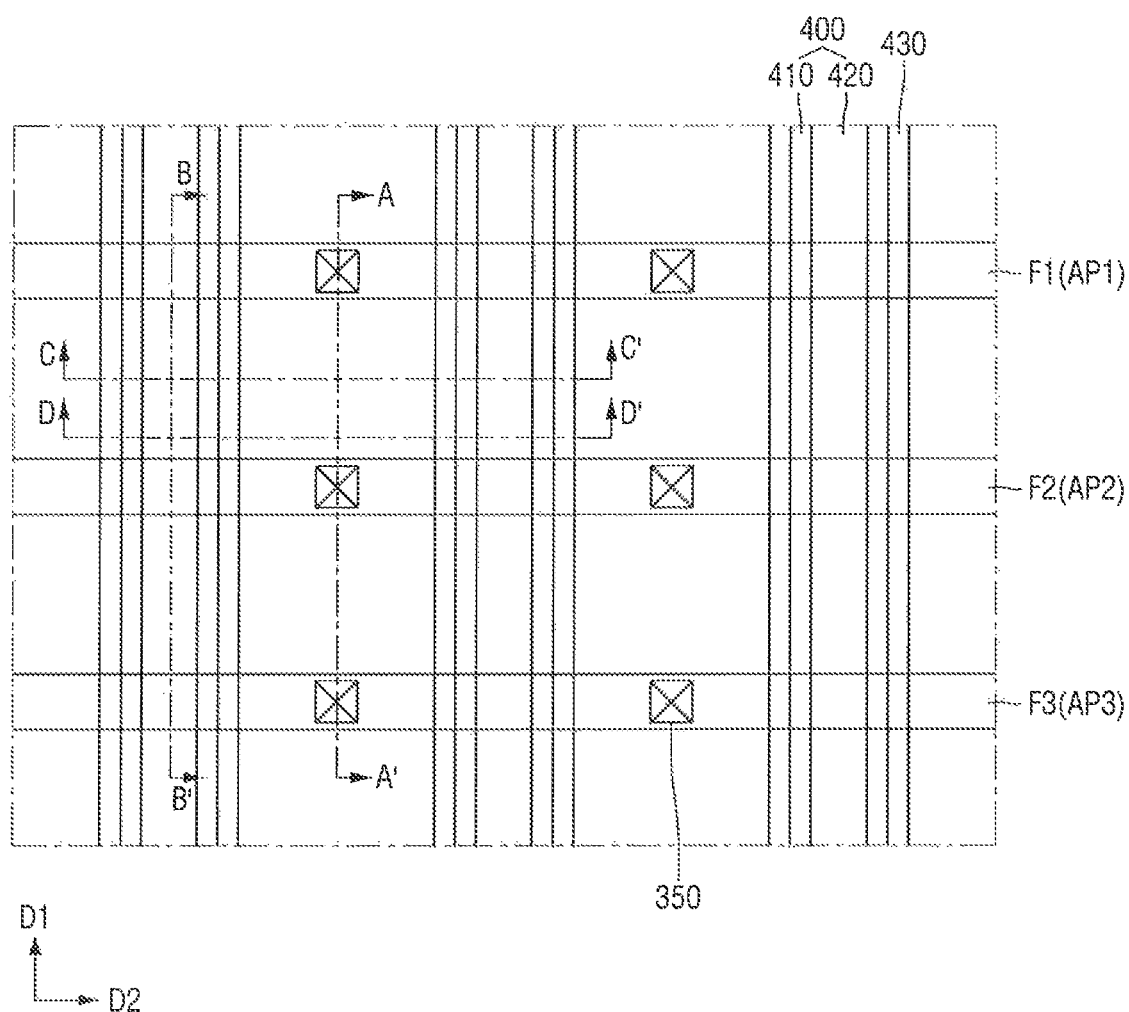
FIG. 1 is a layout view illustrating a semiconductor device according to exemplary embodiments of the present inventive concept.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It should be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. Other words used to describe the relationship between elements should be interpreted in a like fashion.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Hereinafter, a semiconductor device according to exemplary embodiments of the present inventive concept will be described with reference to FIGS. 1 to 7.

Figure 2:
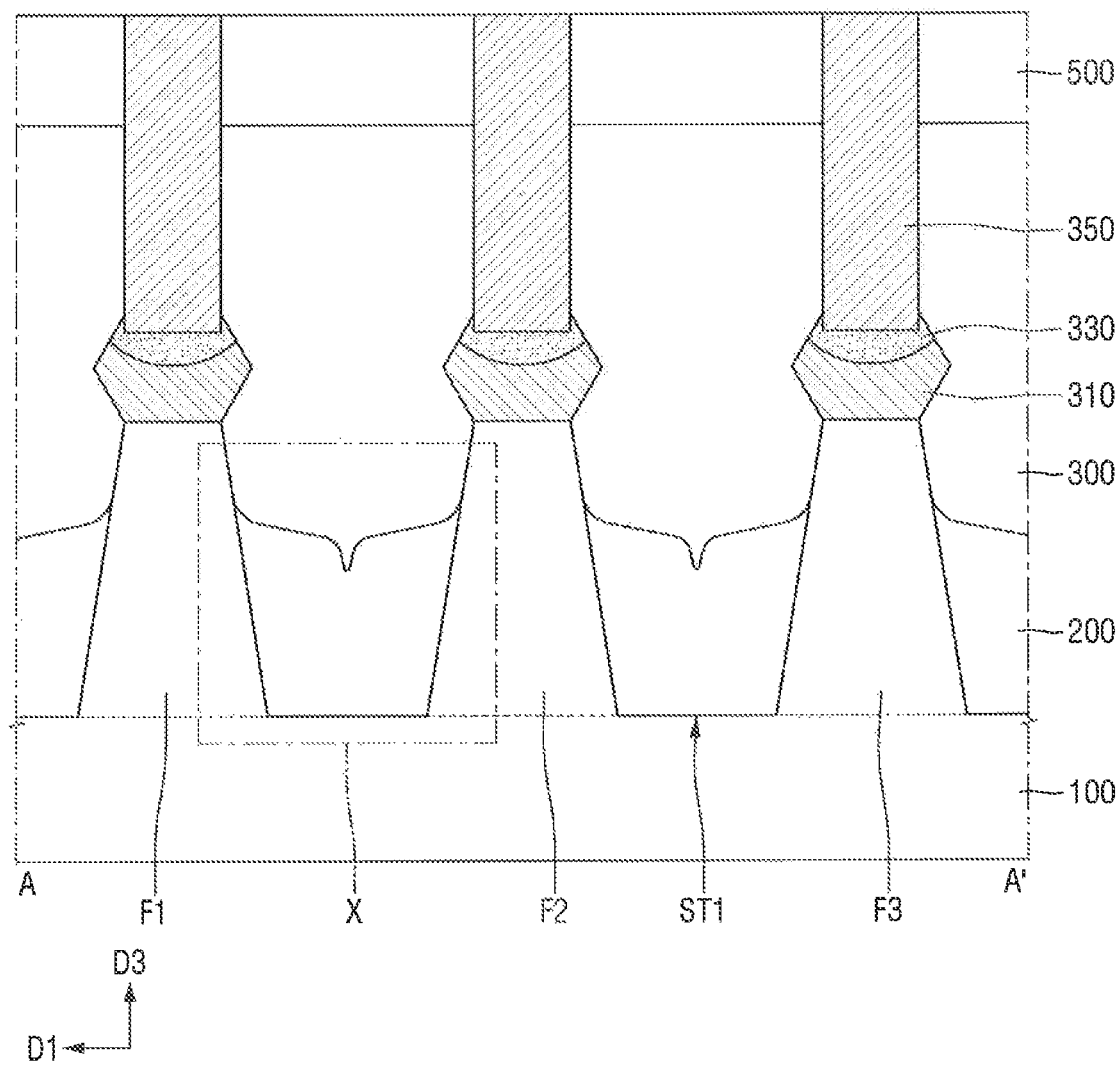
FIG. 2 is a cross-sectional view taken along line A-A' of FIG. 1 according to exemplary embodiments of the present inventive concept.
Figure 3:
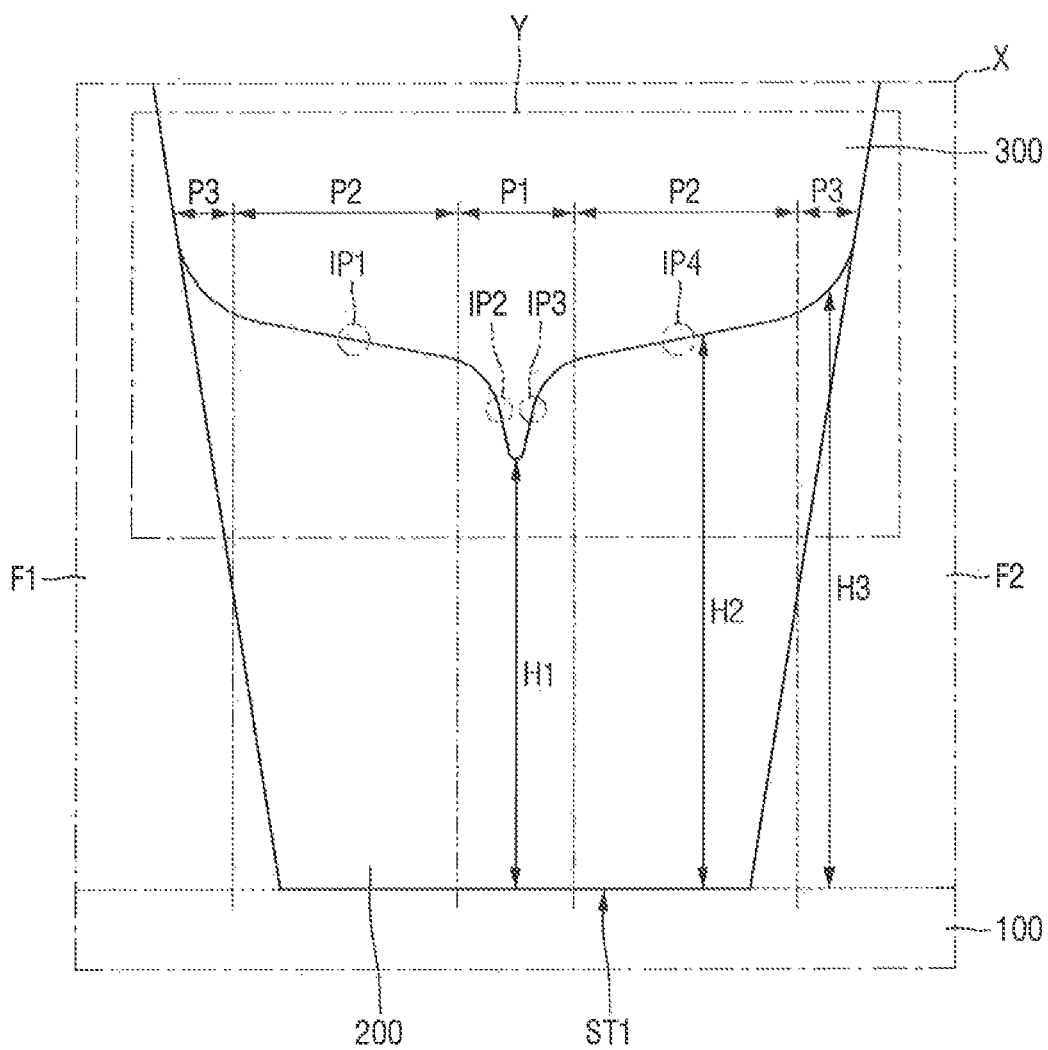
FIG. 3 is an enlarged view of region X of FIG. 2 according to exemplary embodiments of the present inventive concept.
Figure 4:
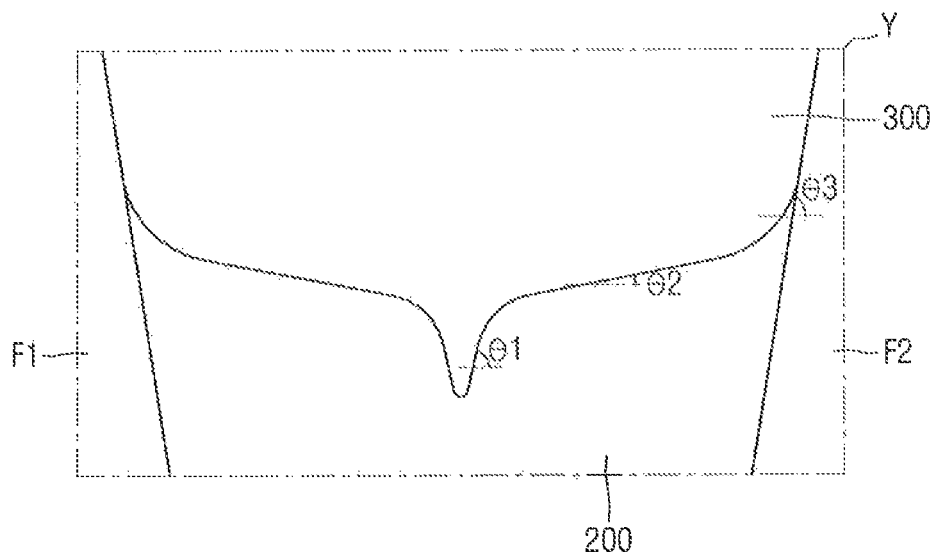
FIG. 4 is an enlarged view of region Y of FIG. 3 according to exemplary embodiments of the present inventive concept.
Figure 5:
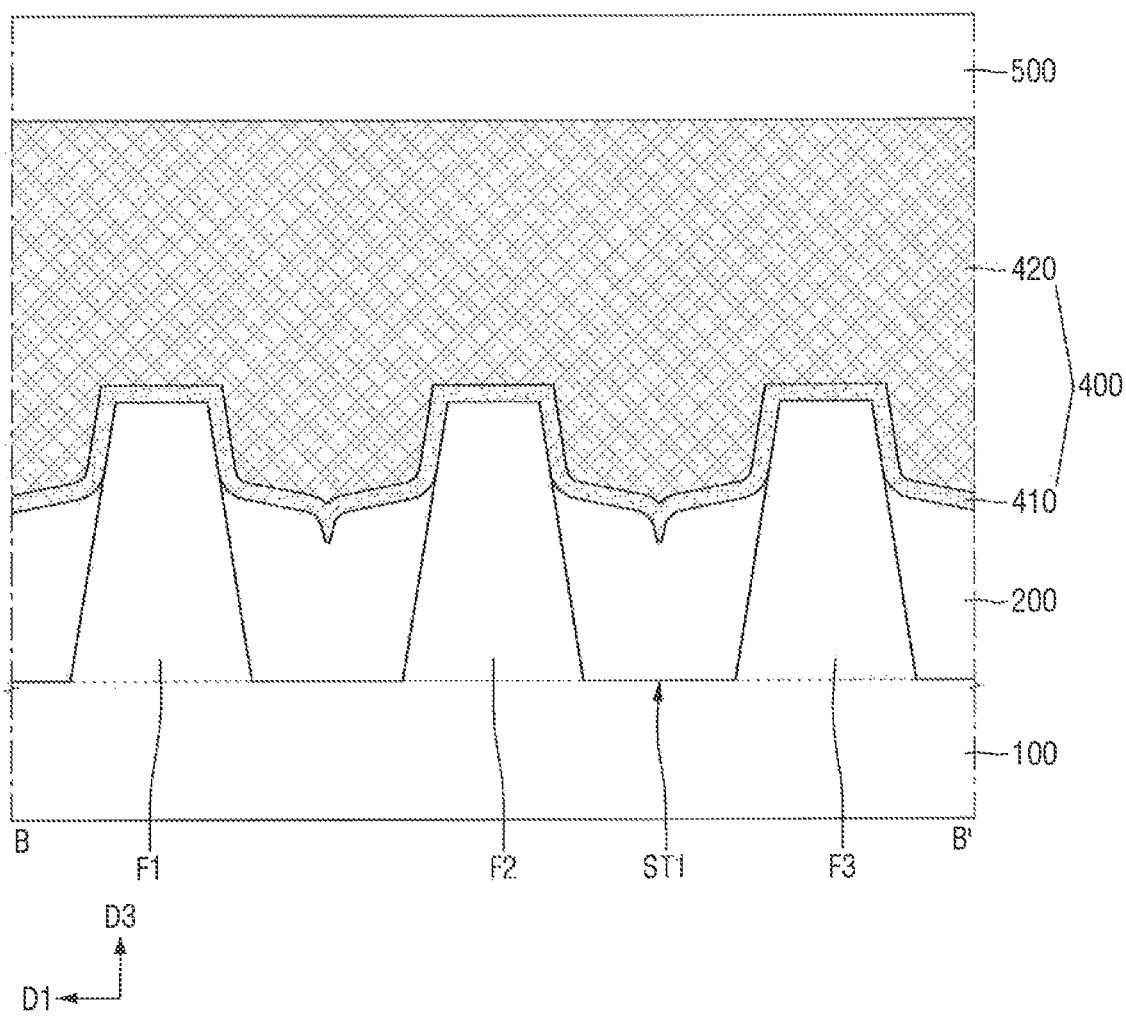
FIGS. 5 and 6 are cross-sectional views taken along line B-B' of FIG. 3 according to exemplary embodiments of the present inventive concept.
Figure 6:
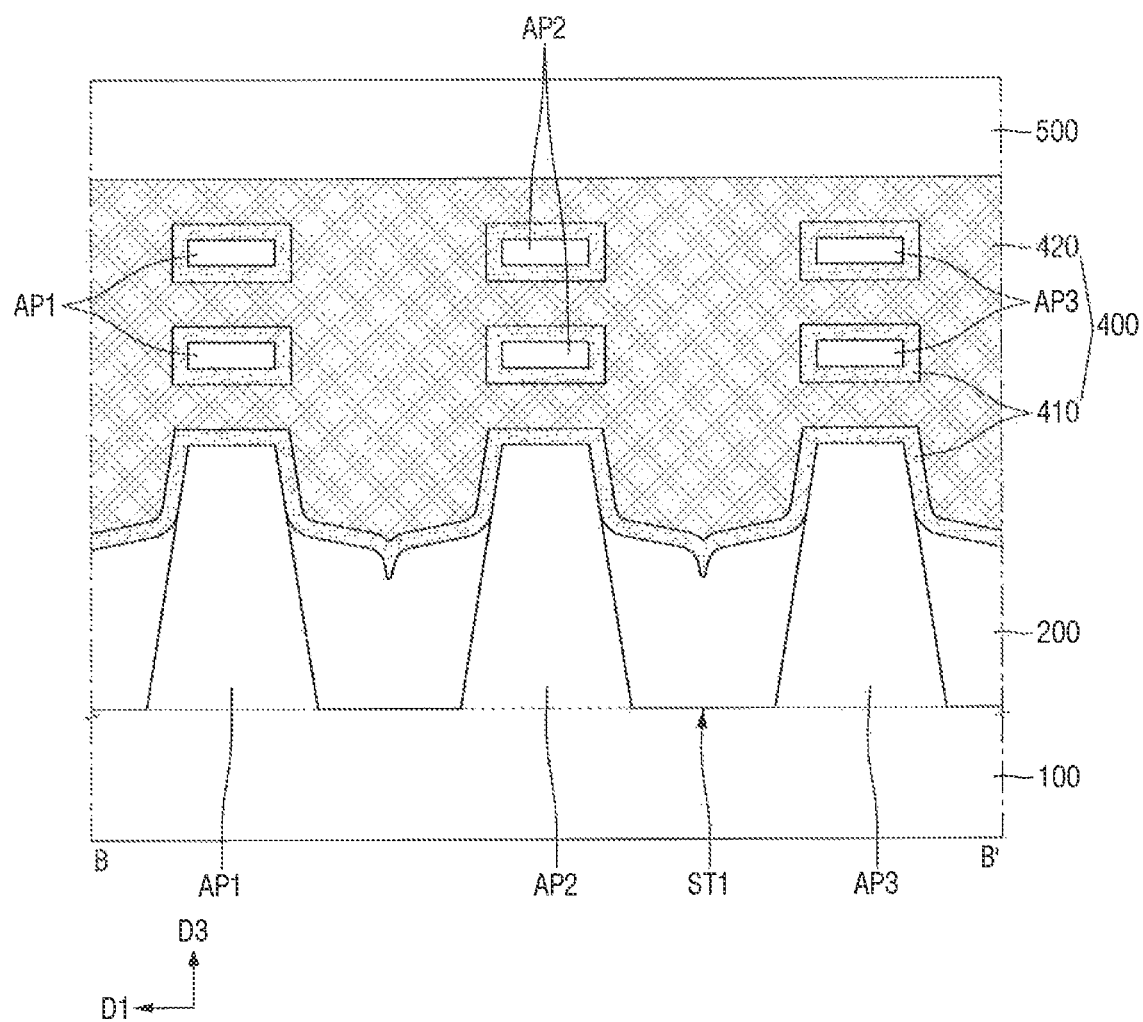
Figure 7:
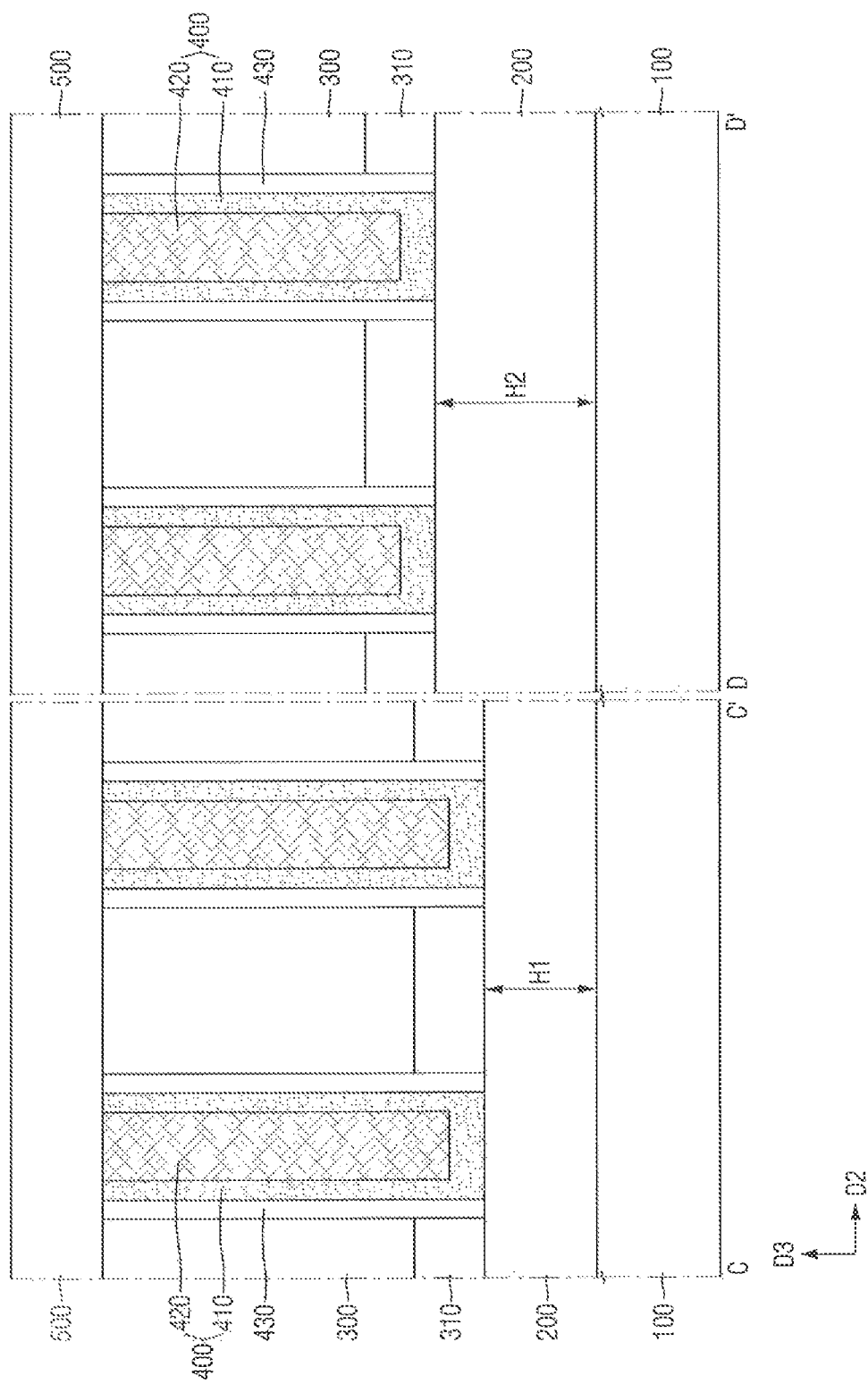
FIG. 7 is a cross-sectional view taken along lines C-C' and D-D' of FIG. 1 according to exemplary embodiments of the present inventive concept.

FIG. 1 is a layout view illustrating a semiconductor device according to exemplary embodiments of the present inventive concept. FIG. 2 is a cross-sectional view taken along line A-A' of FIG. 1 according to exemplary embodiments of the present inventive concept. FIG. 3 is an enlarged view of region X of FIG. 2 according to exemplary embodiments of the present inventive concept. FIG. 4 is an enlarged view of region Y of FIG. 3 according to exemplary embodiments of the present inventive concept. FIGS. 5 and 6 are cross-sectional views taken along line B-B' of FIG. 3 according to exemplary embodiments of the present inventive concept. FIG. 7 is a cross-sectional view taken along lines C-C' and D-D' of FIG. 1 according to exemplary embodiments of the present inventive concept.

Referring to FIGS. 1 to 5, a semiconductor device according to exemplary embodiments of the present inventive concept includes a substrate 100, first, second and third fins F1, F2 and F3, a shallow trench ST1, a field insulating film 200, a source/drain 310, a first interlayer insulating film 300, a silicide 330, a contact 350, and a second interlayer insulating film 500.

A first direction D1 may be any one direction in a horizontal direction. A second direction D2 may be a direction intersecting the first direction D1, for example, a direction substantially perpendicular to the first direction D1. A third direction D3 may be a direction intersecting both the first direction D1 and the second direction D2. For example, the third direction D3 may be a direction substantially perpendicular to both the first direction D1 and the second direction D2. In this case, the first direction D1 and the second direction D2 may be horizontal directions substantially perpendicular to each other, and the third direction D3 may be a vertical direction. For example, the first direction D1, the second direction D2 and the third direction D3 may be directions orthogonal to one another.

The substrate 100 may be made of one or more semiconductor materials including, for example, Si, Ge, SiGe, GaP, GaAs, SiC, SiGeC, InAs and InP. Alternatively, a silicon on insulator (SOI) substrate may be used.

The first, second and third fins F1, F2 and F3 may extend in the second direction D2 and may be spaced apart from each other in the first direction D1. The first, second and third fins F1, F2 and F3 may be sequentially disposed in the first direction D1. For example, the second fin F2 may be located between the first fin F1 and the third fin F3.

Although the exemplary embodiments described herein include three fins F1, F2 and F3, exemplary embodiments of the present inventive concept are not limited thereto. For example, according to exemplary embodiments, a different number of fins may be included.

The first, second and third fins F1, F2 and F3 may include some parts of the substrate 100, and may include an epitaxial layer grown from the substrate 100. The first, second and third fins F1, F2 and F3 may include, for example, Si, SiGe, etc.

The first, second and third fins F1, F2 and F3 may include compound semiconductors, and may include, for example, group IV-IV compound semiconductors or group III-V compound semiconductors.

For example, taking the group IV-IV compound semiconductor as an example, the first, second and third fins F1, F2 and F3 may be a binary compound or a ternary compound containing at least two or more among carbon (C), silicon (Si), germanium (Ge) and tin (Sn), or a compound obtained by doping these elements with a group IV element.

Taking the group III-V compound semiconductor as an example, the first, second and third fins F1, F2 and F3 may be any one of a binary compound, a ternary compound, and a quaternary compound formed by combining at least one of aluminum (Al), gallium (Ga) and indium (In) as group III elements with one of phosphorus (P), arsenic (As), and antimony (Sb) as group V elements.

In the semiconductor device according to the exemplary embodiments described herein, the first, second and third fins F1, F2 and F3 will be described as including silicon. However, exemplary embodiments of the present inventive concept are not limited thereto.

The shallow trench ST1 may be formed on side surfaces of the first, second, and third fins F1, F2, and F3 in the first direction D1, respectively. For example, the shallow trench ST1 may be formed between the first and second fins F1 and F2, and the shallow trench ST1 may be formed between the second and third fins F2 and F3. For example, the shallow trenches ST1 formed between the first, second and third fins F1, F2 and F3 may be formed in the same manner. However, exemplary embodiments of the present inventive concept are not limited thereto, and the shallow trenches may be implemented differently from each other when being formed.

The field insulating film 200 may fill the shallow trench ST1. The field insulating film 200 may expose some of the upper parts and the side surfaces of the first, second and third fins F1, F2 and F3.

The field insulating film 200 may include, for example, at least one of silicon oxide, silicon nitride, silicon oxynitride, and a low dielectric constant material having a dielectric constant lower than that of silicon oxide. The low dielectric constant material may include, but is not limited to, for example, Flowable Oxide (FOX), Tonen SilaZene (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped Silicon Oxide (CDO), Xerogel, Aerogel, Amorphous Fluorinated Carbon, Organo Silicate Glass (OSG), Parylene, bis-benzocyclobutenes (BCB), SiLK, polyimide, porous polymeric material or combinations thereof.

The field insulating film 200 may include a material that applies stress to the first, second and third fins F1, F2 and F3. If the field insulating film 200 applies stress to the channels of the transistors formed on the first, second and third fins F1, F2 and F3, the mobility of electrons or holes which are carriers may be improved.

A gate electrode 420 extends in the first direction D1, and may be disposed on the first, second and third fins F1, F2 and F3 to intersect each of the first, second and third fins F1, F2 and F3.

A gate insulating film 410 may include an interface film including a silicon oxide film, and a high dielectric constant film including a high dielectric constant material. The high dielectric constant film may include a high dielectric constant material having a dielectric constant higher than that of the silicon oxide film. The high dielectric constant material may include, but is not limited to, for example, one or more of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The high dielectric constant film may include a dipole-forming material to adjust a threshold voltage of the gate electrode 420. The dipole-forming material may be at least one of, for example, La, Nd, Eu, Dy, Ho, and Yb. However, the dipole-forming material is not limited thereto.

The gate electrode 420 may include a first conductive film and a second conductive film. The second conductive film may be formed on the gate insulating film 410. The first conductive film may include an n-type or p-type work function regulator. The work function regulator may include, for example, at least one of TiN, TaN, and TiAlC. However, exemplary embodiments of the present inventive concept are not limited thereto. The first conductive film may be formed on the second conductive film. The second conductive film may include, but is not limited to, at least one of W and TiN.

A spacer film 430 may be formed on both sides of the gate electrode 420. Although the spacer film 430 is illustrated as being a single film, exemplary embodiments of the present inventive concept are not limited thereto. For example, in exemplary embodiments, the spacer film 430 may be a multi-film formed by stacking a plurality of films. The shapes of each of the multi-spacers forming the spacer film 430 may be, for example, an I-shape or an L-shape or a combination thereof, depending on the manufacturing process or the application. The spacer film 430 may include, for example, at least one of silicon nitride (SiN), silicon oxynitride (SiON), silicon oxide (SiO$_2$), silicon oxycarbonitride (SiOCN), and a combination thereof.

A source/drain 310 may be disposed on both sides of the gate electrode 420. The source/drain 310 may include an epitaxial layer formed by an epitaxial process. The source/drain 310 may be an elevated source/drain. When the source/drain 310 is an n-type transistor, it may include, for example, a Si epitaxial layer or a SiC epitaxial layer. The source/drain 310 may include, for example, SiP or SIPC with P doped at a high concentration. Alternatively, when the source/drain 310 is a p-type transistor, it may include, for example, a SiGe epitaxial layer.

An outer peripheral surface of the source/drain 310 may be at least one of, for example, a diamond shape, a circular shape and a rectangular shape. FIG. 2 exemplarily illustrates a diamond shape (or a pentagonal shape or a hexagonal shape).

The first interlayer insulating film 300 may cover the upper surfaces of the substrate 100 (or the first to third fins F1, F2 and F3), the source/drain 310 and the field insulating film 200. The first interlayer insulating film 300 may fill the space of the side surfaces of the gate electrodes 420 and the dummy gate electrodes. The upper surface of the first interlayer insulating film 300 may form the same plane as the upper surface of the spacer film 430.

A second interlayer insulating film 500 may be formed on the first interlayer insulating film 300. Each of the first interlayer insulating film 300 and the second interlayer insulating film 500 may include, for example, at least one of silicon oxide, silicon nitride, silicon oxynitride and a low dielectric constant material having a dielectric constant lower than that of silicon oxide.

A contact 350 may penetrate the first interlayer insulating film 300 and the second interlayer insulating film 500 to be in contact with the source/drain 310. The contact 350 may be deeper than the upper surface of the source/drain 310. The source/drain 310 may form a silicide 330 at an interface with the contact 350. The contact 350 may include, for example, barrier metal on the surface being in contact with the first interlayer insulating film 300, the second interlayer insulating film 500, and the source/drain 310.

The silicide 330 may improve the interface characteristics between the source/drain 310 and the contact 350. The silicide 330 may be formed inside the source/drain 310 to be in direct contact with the contact 350.

Referring to FIG. 3, the semiconductor device according to exemplary embodiments of the present inventive concept may include a field insulating film 200 formed in a shape of a brace (or curly bracket) (e.g., }) in which an upper surface thereof is recessed toward the substrate 100. Such a brace (or curly bracket) shape is shown, for example, in FIG. 3. For example, the brace (or curly bracket) shape may include curved portions that meet at an indent (or recess) toward the substrate 100. According to exemplary embodiments, the curved portions may be symmetrical with respect to the indent (or recess) as shown, for example, in FIG. 3, or may be asymmetrical with respect to the indent (or recess) as shown, for example, in FIG. 8.

The field insulating film 200 which fills the shallow trench ST1 formed between the first fin F1 and the second fin F2, or the field insulating film 200 which fills the shallow trench ST1 formed between the second fin F2 and the third fin F3, may have a lowest height at about the center in the first direction D1 in which the first, second and third fins F1, F2 and F3 are spaced part from each other. In this case, the height refers to a distance from the upper surface of the substrate 100 in the third direction D3 except the first, second and third fins F1, F2 and F3. As illustrated in FIG. 3, the field insulating film 200 may include a first portion P1 including the center of the shallow trench ST1, and a second portion P2 and a third portion P3 formed sequentially from the center in the first direction D1. For example, the second portion P2 may be adjacent to the first portion P1, and the third portion P3 may be adjacent to the second portion P2 and to a side wall of the shallow trench ST1. The first portion P1, the second portion P2 and the third portion P3 have a first height H1, a second height H2 and a third height H3, respectively, from the upper surface of the substrate 100. The second height H2 may be higher/greater than the first height H1, and the third height H3 may be higher/greater than the second height H2. Thus, among the first height H1, the second height H2, and the third height H3, the first height H1 may be lowest/smallest.

According to exemplary embodiments, the upper surface of the field insulating film 200 which fills the shallow trench ST1 may have an inflection point. According to exemplary embodiments, the upper surface of the field insulating film 200 may have three or more inflection points. As illustrated in FIG. 3, the upper surface of the field insulating film 200 according to an exemplary embodiment of the present inventive concept may have a first inflection point IP1, a second inflection point IP2, a third inflection point IP3, and a fourth inflection point IP4. In addition, the height from the upper surface of the substrate 100 to the upper surface of the field insulating film 200 may be lowest in a region between the second inflection point IP2 and the third inflection point IP3.

Referring to FIG. 4, the semiconductor device according to exemplary embodiments of the present inventive concept may be formed such that a slope formed by the first direction D1 in which the first fin F1 and the second fin F2 are spaced apart from each other and the upper surface of the field insulating film 200 is not uniform. For example, the slope formed by the first direction D1 and the upper surface of the field insulating film 200 may gradually decrease and then increase from the center of the upper surface of the field insulating film 200 toward the side wall of the first fin F1 or the second fin F2. As illustrated, the field insulating film 200 may include regions in which the slopes formed with the first direction D1 are a first slope θ1, a second slope θ2 and a third slope θ3, respectively. The first slope θ1, the second slope θ2 and the third slope θ3 may be the slopes of the regions included in the first portion P1, the second portion P2 and the third portion P3 of FIG. 3, respectively. According to exemplary embodiments, the first slope θ1 may be greater than the second slope θ2, and the third slope θ3 may be greater than the second slope θ2. The signs of the first, second and third slopes θ1, θ2 and θ3 are the same. Thus, in exemplary embodiments, a height from the substrate 100 to the upper surface of the field insulating film 200 is not uniform.

Referring to FIG. 5, the semiconductor device according to exemplary embodiments of the present inventive concept may further include a gate structure 400 which is formed in some parts of the upper surface of the field insulating film 200 and the upper surfaces and the side surfaces of the first, second and third fins F1, F2 and F3, and extends in the first direction D1. The gate structure 400 may include the gate insulating film 410 and the gate electrode 420, and a lower surface of the gate insulating film 410 and a lower surface of the gate electrode 420 may be formed in a shape of a brace. The first fin F1, the second fin F2 and the third fin F3 may penetrate the gate structure 400.

For example, the lower surface of the gate structure 400 may correspond to the shape of the upper surface of the field insulating film 200 described above. For example, the lower surface of the gate structure 400 may be formed in the shape of the brace, and the height of the central portion of the lower surface of the gate structure 400 from the substrate 100 may be the lowest relative to other portions of the lower surface of the gate structure 400. Further, the slope formed by the lower surface of the gate structure 400 with the first direction D1 may gradually decrease and then increase from the center toward the side surfaces of the first, second and third fins F1, F2 and F3.

Referring to FIG. 6, the semiconductor device according to exemplary embodiments of the present inventive concept may include a gate structure 400 extending in the first direction D1, a plurality of activation patterns AP1, AP2 and AP3 penetrating the gate structure 400, extending in the second direction D2 and separated in the first direction D1, a shallow trench ST1 formed between the plurality of activation patterns AP1, AP2 and AP3, and a field insulating film 200 which fills at least a part of the shallow trench ST1 and is formed in the shape of the brace recessed toward the substrate 100. For example, according to exemplary embodiments, the activation patterns AP1, AP2 and AP3 may be implemented as a nanosheet element.

According to an exemplary embodiment as illustrated in FIG. 6, the shallow trench ST1 formed between the first, second and third activation patterns AP1, AP2 and AP3 may be the same as the shallow trench ST1 formed between the first, second and third fins F1, F2 and F3 of FIG. 2.

Each of the activation patterns AP1, AP2, and AP3 may include an upper pattern in which a periphery is surrounded by the gate structure 400, and a lower pattern that is spaced apart from the upper pattern and protrudes from the substrate 100.

Although FIG. 6 shows that the number of activation patterns AP1, AP2, and AP3 in which the periphery is surrounded by the gate structure 400 is two for each of the activation patterns AP1, AP2, and AP3, exemplary embodiments of the present inventive concept are not limited thereto. For example, in exemplary embodiments, the number of activation patterns AP1, AP2, and AP3 in which the periphery is surrounded by the gate structure 400 may be one or may be three or more.

Referring to FIG. 7, a semiconductor device according to exemplary embodiments of the present inventive concept may include a gate structure 400, a field insulating film 200, and a first interlayer insulating film 300 having different heights in the second direction D2. In the description herein, it is assumed that the C-C' cross section is a region included in the first portion P1 of FIG. 3 and the D-D' cross section is a region included in the second portion P2 of FIG. 3.

The height of the field insulating film 200 in the C-C' cross section is a first height H1, the height of the field insulating film 200 in the D-D' cross section is a second height H2, and as described above, the second height H2 is formed to be higher than the first height H1. Thus, the formed heights of the lower surfaces of the gate structure 400 and the spacer film 430 formed on the field insulating film 200 may be different from each other. For example, the heights in the third direction D3 of the lower surfaces of the gate structure 400 and the spacer film 430 in the C-C' cross section are formed to be lower than the heights in the third direction D3 of the lower surfaces of the gate structure 400 and the spacer film 430 in the D-D' cross section. The heights of the lower surfaces of the gate structure 400 and the spacer film 430 refer to the height from the upper surface of the substrate 100 in the third direction D3.

The first interlayer insulating film 300, the gate insulating film 410, the gate electrode 420 and the spacer film 430 have upper surfaces of the same plane through a planarization process, and the second interlayer insulating film 500 is formed on the upper surfaces of the first interlayer insulating film 300, the gate insulating film 410, the gate electrode 420 and the spacer film 430. The heights of the gate structure 400 and the first interlayer insulating film 300 in the third direction D3 may also be different between the C-C' cross section and the D-D' cross section. For example, the lower surfaces of the gate structure 400 and the first interlayer insulating film 300 of the C-C' cross section may have heights lower than those of the lower surfaces of the gate structure 400 and the first interlayer insulating film 300 of the D-D' cross section, and the heights of the gate structure 400 and the first interlayer insulating film 300 of the C-C' cross section may be greater than the heights of the gate structure 400 and the first interlayer insulating film 300 of the D-D' cross section.

In a semiconductor device according to exemplary embodiments of the present inventive concept, by forming a plurality of segregation layers using multiple atomic layer deposition (ALD) cycles and an inhibitor plasma, the deposition at the upper end portion of shallow trench ST1 is selectively suppressed, and the deposition at the lower end portion of the shallow trench ST1 is suppressed to be less than the upper end portion or is not suppressed. Thus, a bottom-up fill of the field insulating film 200 may be improved, and an occurrence of voids or seams may be minimized or reduced. A method for manufacturing a semiconductor device according to an exemplary embodiment of the present inventive concept using the ALD cycle and the inhibitor plasma will be described later with reference to FIGS. 13 through 21.

Figure 8:
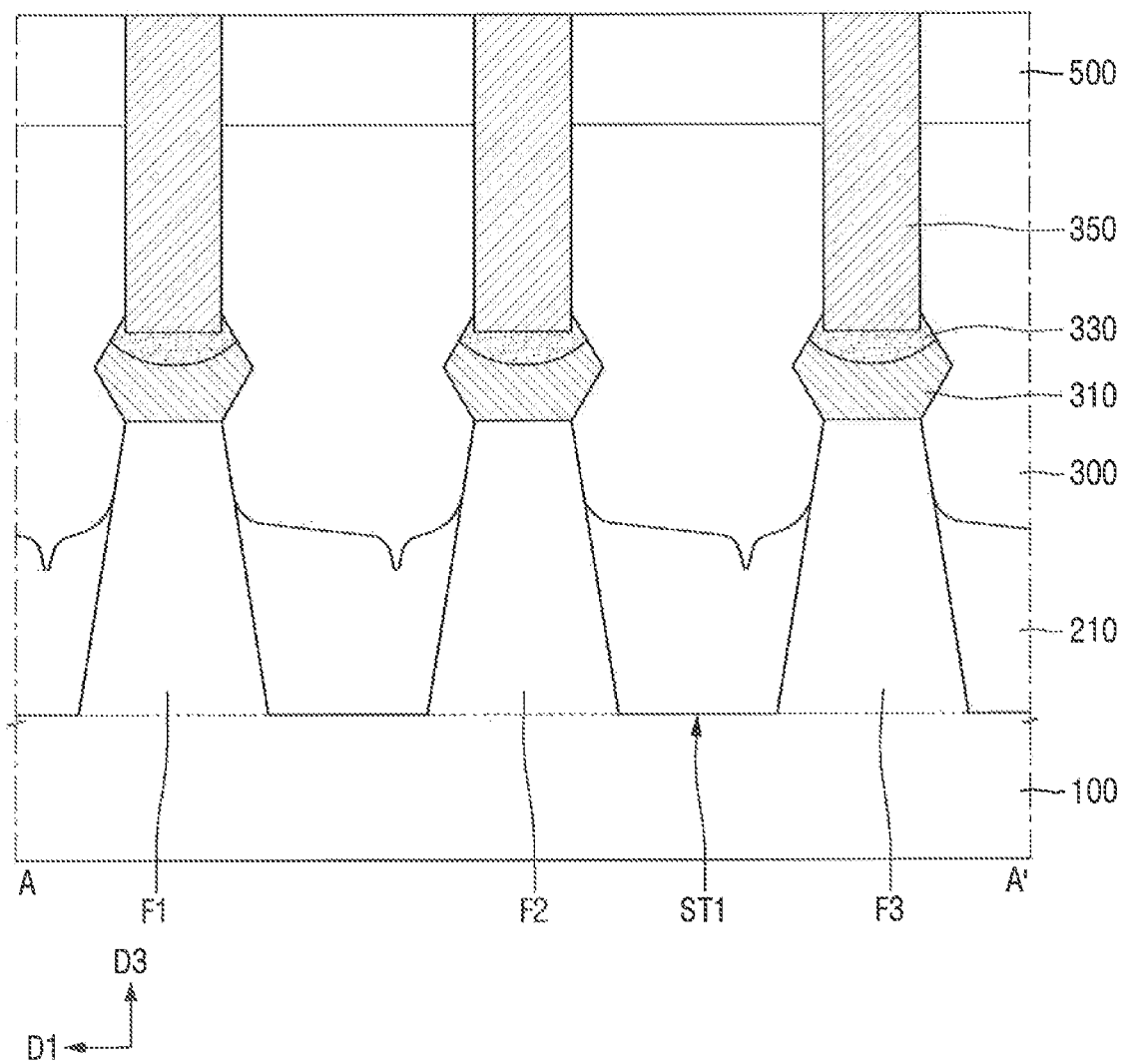
FIG. 8 is a cross-sectional view illustrating a semiconductor device according to exemplary embodiments of the present inventive concept.

FIG. 8 is a cross-sectional view illustrating a semiconductor device according to exemplary embodiments of the present inventive concept. FIG. 8 is a cross-sectional view taken along line A-A' of FIG. 1 according to exemplary embodiments of the present inventive concept.

Referring to FIG. 8, according to exemplary embodiments, the upper surface of a field insulating film 210 may be formed asymmetrically in the first direction D1. As illustrated, in exemplary embodiments, a portion having the smallest height from the upper surface of the substrate 100 to the upper surface of the field insulating film 210 is not the central portion of the field insulating film 210 in the first direction D1. For example, according to exemplary embodiments, the height of the second portion P2 or the third portion P3 other than the first portion P1 of FIG. 3 may be the lowest relative to the other portions.

In such a case, the slope formed by the upper surface of the field insulating film 210 with the first direction D1 may gradually decrease and then increase toward the side walls of the fins adjacent to each other on the basis of the portion having the lowest height.

The upper surface of the field insulating film 210 which fills the shallow trench ST1 may have four inflection points, and may have two inflection points on both sides on the basis of the portion having the lowest height.

Figure 9:
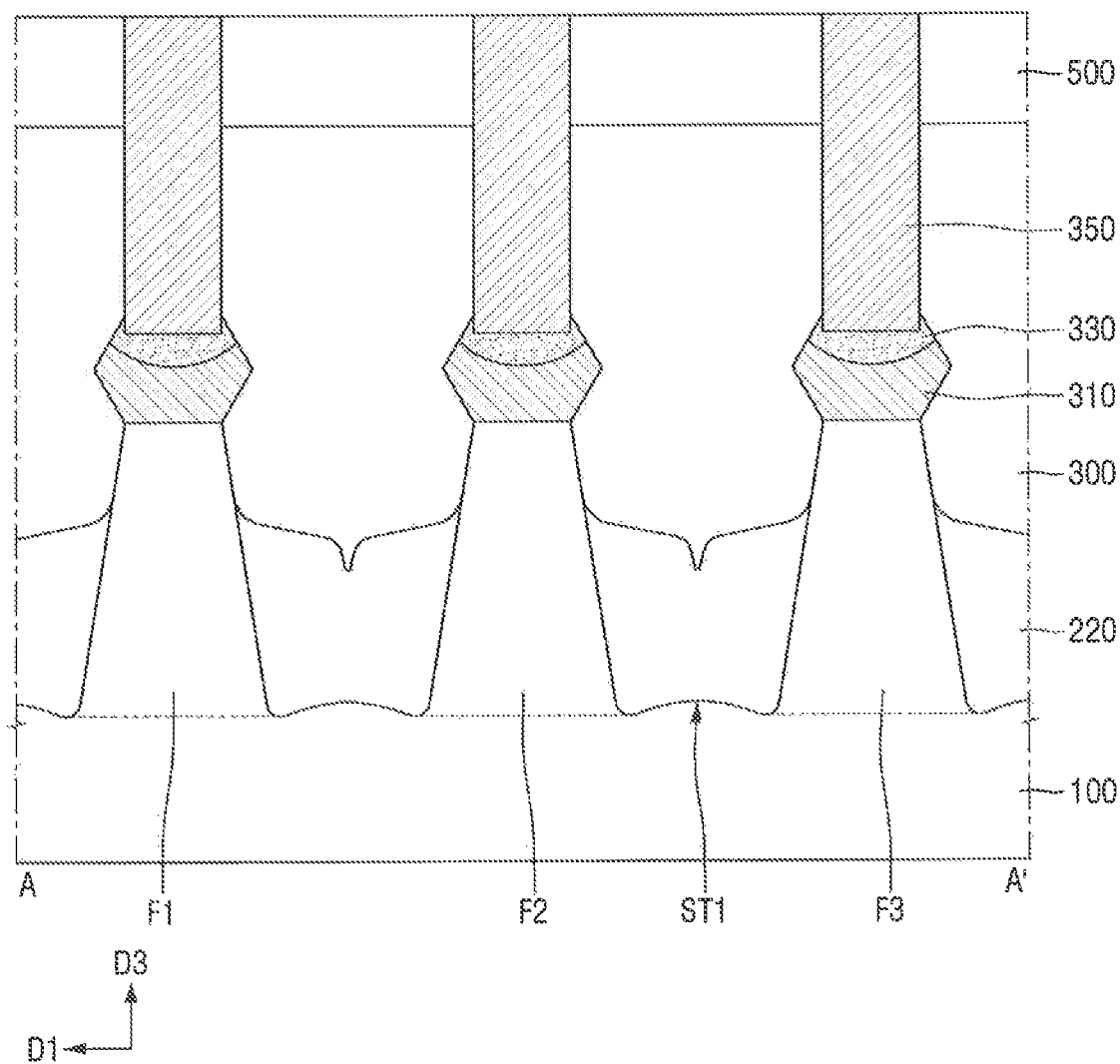
FIG. 9 is a cross-sectional view illustrating a semiconductor device according to exemplary embodiments of the present inventive concept.
Figure 10:
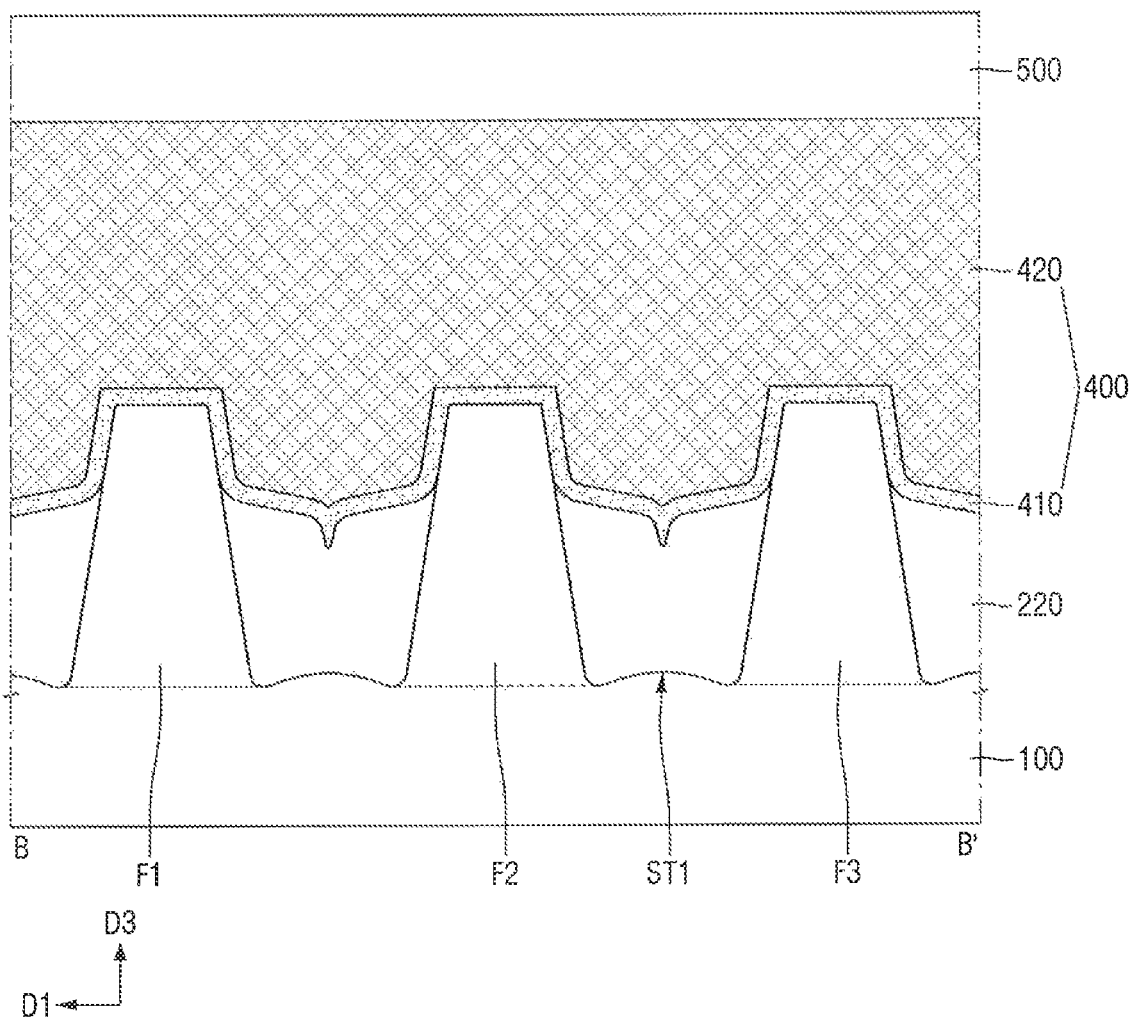
FIG. 10 is a cross-sectional view illustrating a semiconductor device according to exemplary embodiments of the present inventive concept.

FIGS. 9 and 10 are cross-sectional views illustrating a semiconductor device according to exemplary embodiments of the present inventive concept. FIG. 9 is a cross-sectional view taken along line A-A' of FIG. 1 according to exemplary embodiments of the present inventive concept, and FIG. 10 is a cross-sectional view taken along line B-B' of FIG. 1 according to exemplary embodiments of the present inventive concept.

Referring to FIGS. 9 and 10, according to exemplary embodiments, the lower surface of a field insulating film 220 may be formed in a shape recessed in an opposite direction of the substrate 100. For example, the lower surface of the shallow trench ST1 is not formed to be substantially parallel to the first direction D1 or the second direction D2, and at least a part of the lower surface of the shallow trench ST1 may be formed in a shape recessed toward the upper surface of the field insulating film 220. As a result, the lower surface of the field insulating film 220 may be formed in a shape recessed in the opposite direction of the substrate 100 in the third direction D3.

Figure 11:
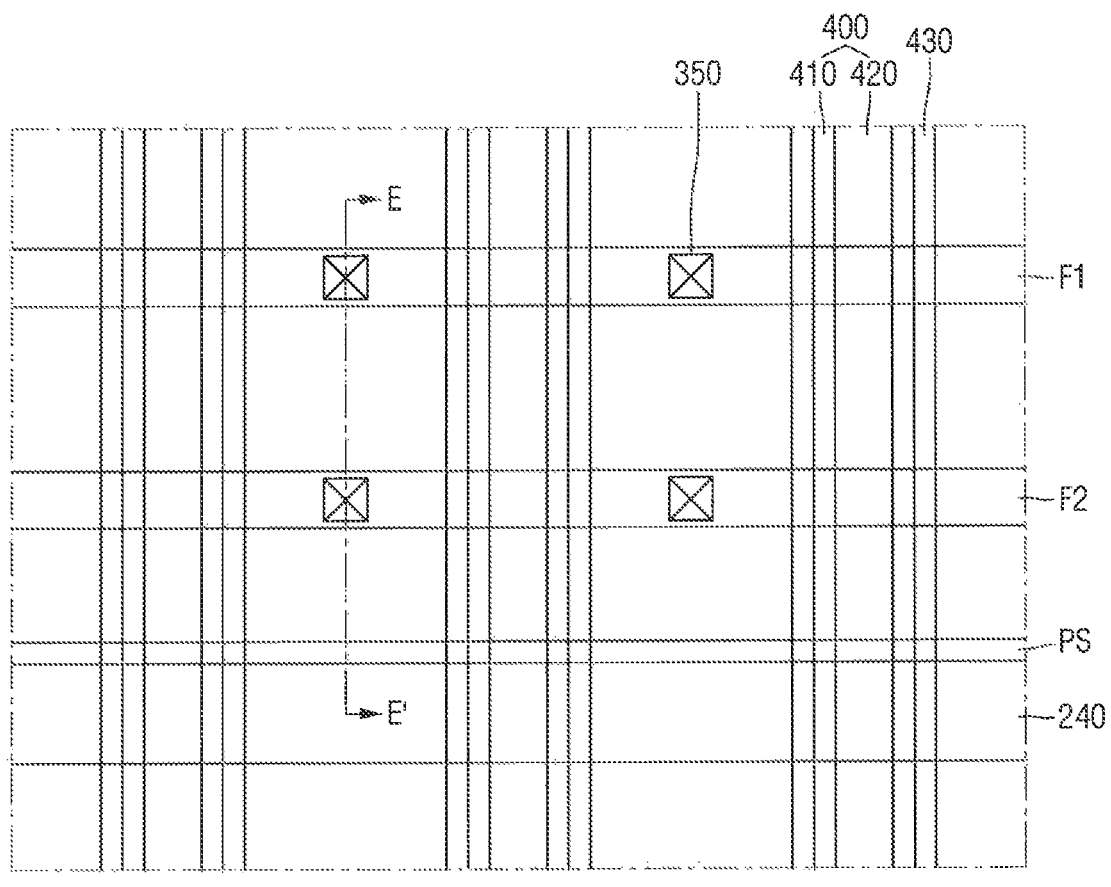
FIG. 11 is a layout diagram illustrating a semiconductor device according to exemplary embodiments of the present inventive concept.
Figure 12:
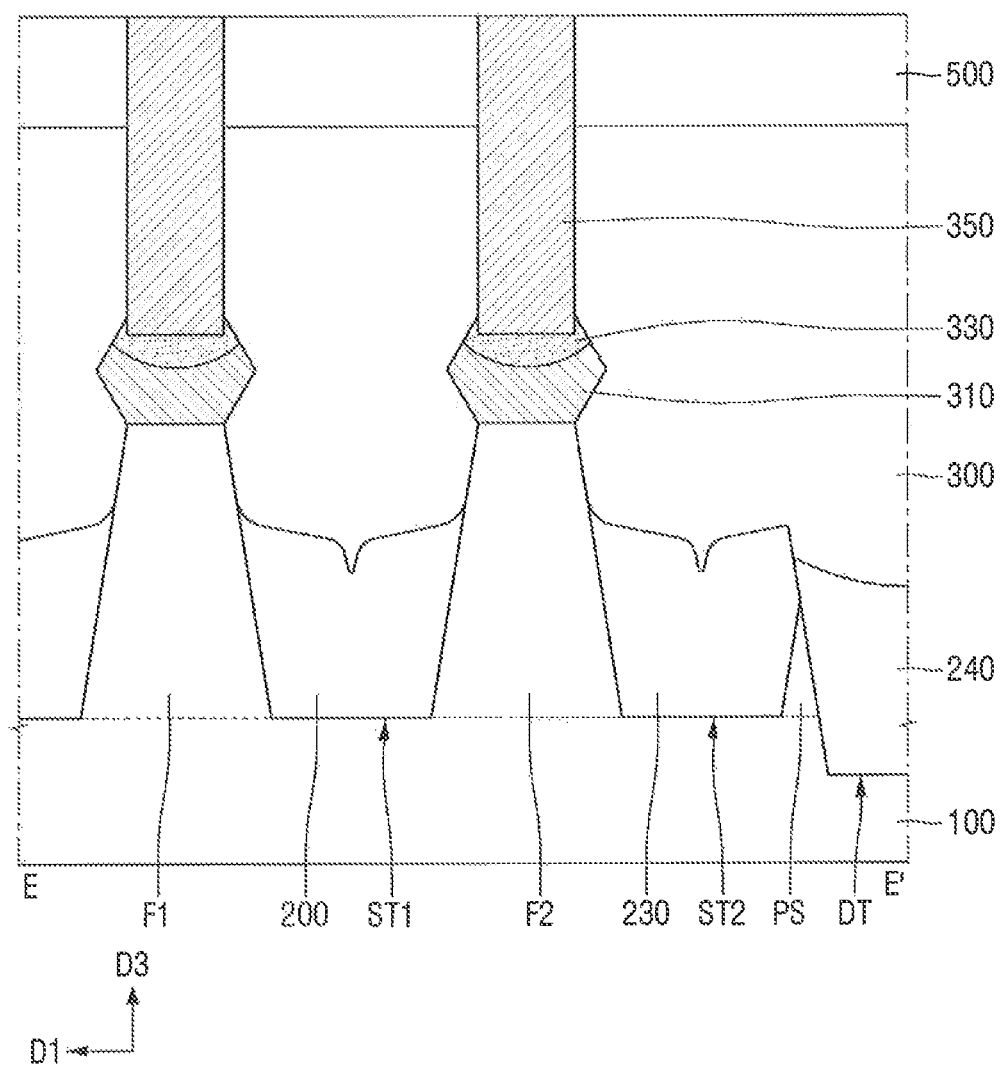
FIG. 12 is a cross-sectional view taken along line E-E' of FIG. 11 according to exemplary embodiments of the present inventive concept.

FIG. 11 is a layout view illustrating a semiconductor device according to exemplary embodiments of the present inventive concept. FIG. 12 is a cross-sectional view taken along line E-E' of FIG. 11 according to exemplary embodiments of the present inventive concept.

Referring to FIGS. 11 and 12, a semiconductor device according to exemplary embodiments of the present inventive concept may further include a first shallow trench ST1, a second shallow trench ST2, a protrusion structure PS, and a deep trench DT. The first shallow trench ST1 is formed between the first and second fins F1 and F2, and the second shallow trench ST2 is formed between the second fin F2, the protrusion structure PS and the deep trench DT. The first shallow trench ST1 may have the same shape as the shallow trench ST1 described above with reference to FIGS. 2 through 7. The protrusion structure PS is a residue in which the existing fin structure remains unremoved, and thus, the protrusion structure PS may have a shape different from the first and second fins F1 and F2.

The protrusion structure PS may protrude from the bottom of the second shallow trench ST2, and may be lower than the upper surface of a field insulating film 230. As illustrated, the protrusion structure PS may be located at a boundary between the second shallow trench ST2 and the deep trench DT.

According to exemplary embodiments, the deep trench DT may be deeper than the first and second shallow trenches ST1 and ST2. The deep trench DT is directly connected to the second shallow trench ST2. Since the depth of the deep trench DT is deeper than the depth of the second shallow trench ST2, a step may be formed on the bottom surface of the portion by which both trenches are connected.

The side surface of the deep trench DT may be in contact with the field insulating film 230 and the protrusion structure PS. The uppermost part of the deep trench DT may be the same as the heights of some parts of the uppermost surfaces or the upper surfaces of the field insulating films 200 and 230.

A deep trench insulating film 240 may fill the deep trench DT. The deep trench insulating film 240 may include, for example, silicon oxide.

The upper surface of the deep trench insulating film 240 may be lower than the upper surfaces of the field insulating films 200 and 230. Accordingly, the upper surface of the deep trench insulating film 240 may be lower than the uppermost part of the deep trench DT.

Accordingly, the deep trench DT may include a portion that is in contact with the deep trench insulating film 240, and a portion exposed by the deep trench insulating film 240.

According to exemplary embodiments, the segregation layer (SL1 of FIGS. 16 to 21) may be formed on both side walls and the upper surfaces of the first and second fins F1 and F2, the lower surface of the first shallow trench ST1, both side walls and the lower surface of the second shallow trench ST2, and the surface of the protrusion structure PS. The segregation layer SL1 may also be formed on both side walls and the lower surface of the deep trench DT.

FIGS. 13 to 21 are intermediate stage diagrams illustrating a method for manufacturing a semiconductor device according to exemplary embodiments of the present inventive concept. FIGS. 14 to 21 are cross-sectional views taken along line F-F' of FIG. 21. Hereinafter, a semiconductor devices according to exemplary embodiments of the present inventive concept will be described with reference to FIGS. 13 to 21. For convenience of explanation, a further description of elements and aspects previously described may be omitted or simplified herein.

Figure 13:
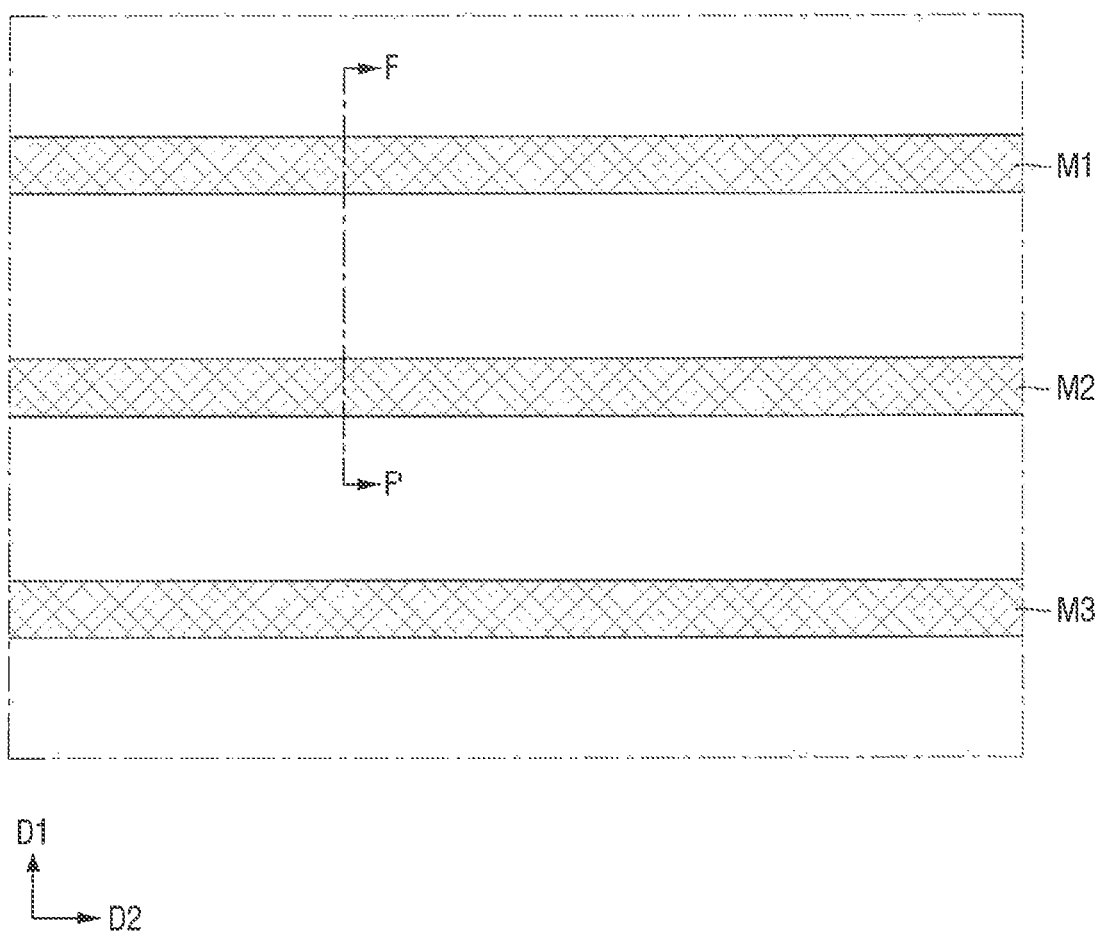
FIGS. 13 to 21 are intermediate stage diagrams illustrating a method for manufacturing a semiconductor device according to exemplary embodiments of the present inventive concept.
Figure 14:
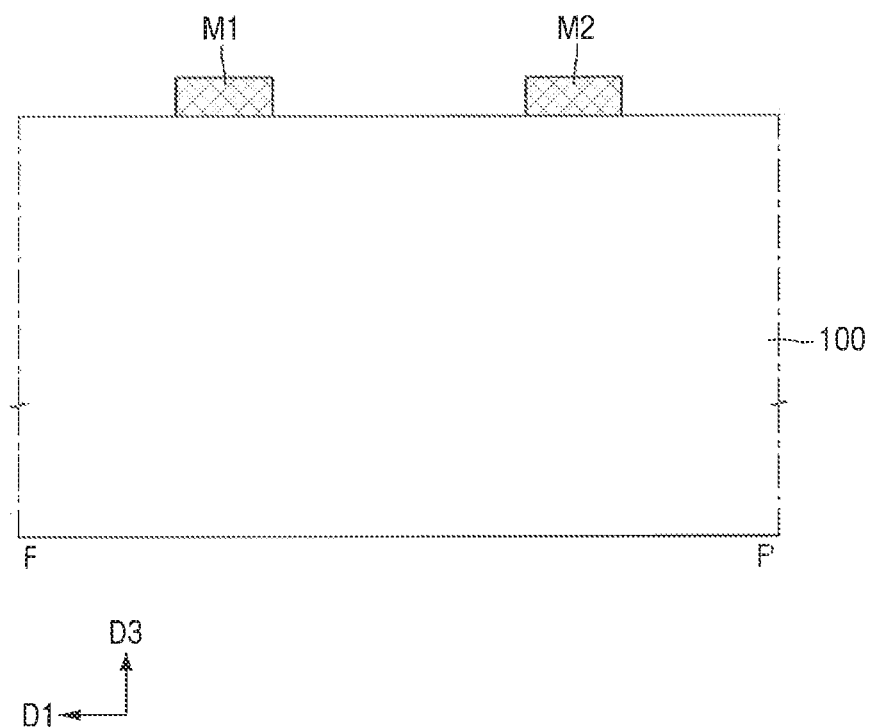

First, referring to FIGS. 13 and 14, first, second and third masks M1, M2 and M3 are formed on the substrate 100.

The substrate 100 may be made of one or more semiconductor materials including, for example, Si, Ge, SiGe, GaP, GaAs, SiC, SiGeC, InAs and InP. Alternatively, a silicon on insulator (SOI) substrate may be used.

The first through third masks M1 through M3 may extend in the second direction D2 and may be spaced apart from each other in the first direction D1. The first through third masks M1 through M3 may be sequentially disposed in the first direction D1.

Although FIGS. 13 and 14 illustrate three masks M1 through M3, exemplary embodiments of the present inventive concept are not limited thereto. For example, the number of masks may be varied according to exemplary embodiments. Further, since FIGS. 15 through 21 are cross-sections taken along line F-F', which includes the first and second masks M1 and M2 but not the third mask M3, FIGS. 15 through 21 illustrate the first and second masks M1 and M2 but not the third mask M3.

Figure 15:
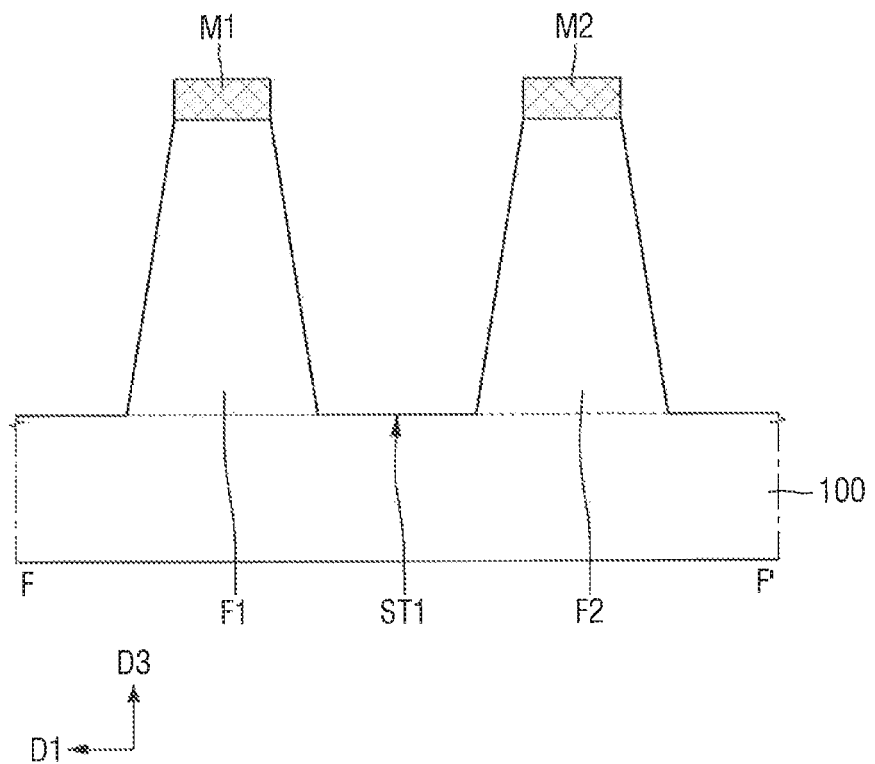

Subsequently, referring to FIG. 15, the substrate 100 is etched using the first and second masks M1 and M2 as masks.

As the substrate 100 is etched, the first and second fins F1 and F2 and the shallow trench ST1 may be formed.

For example, the shallow trench ST1 may be defined by the first fin F1 and the second fin F2.

Figure 16:
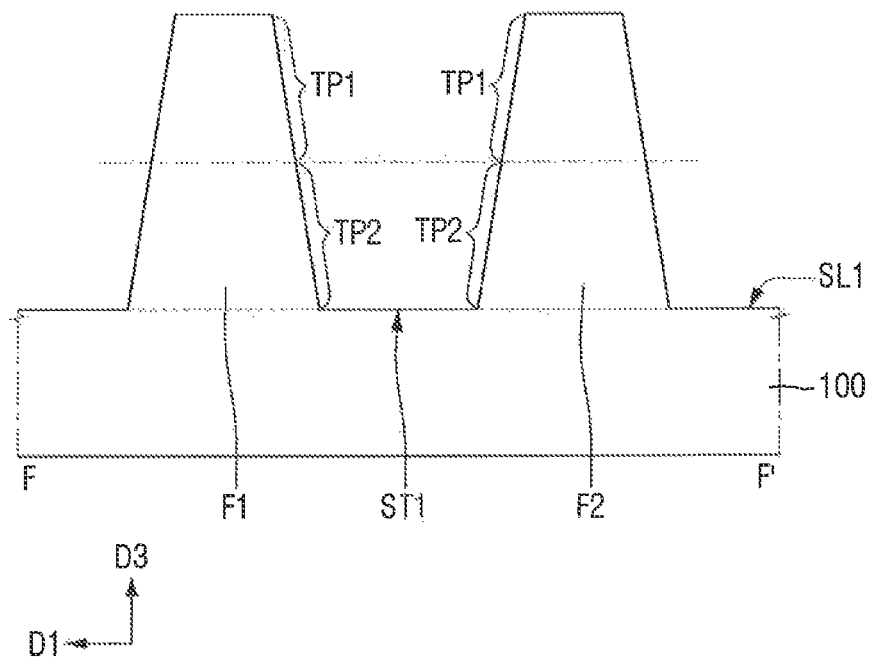

Subsequently, referring to FIG. 16, the first segregation layer SL1 may be formed on the lower surface of the shallow trench ST1, and the side walls and the upper surfaces of the first and second fins F1 and F2. Hereinafter, the side walls adjacent to each other among the side walls of each of the first fin F1 and the second fin F2 will be described. However, it will be understood that this description may be equally applied to the opposite side wall thereof. The side walls of the shallow trench ST1 may refer to the side walls adjacent to each other among the side walls of the first and second fins F1 and F2. In addition, although the first and second masks M1 and M2 are illustrated as being removed, according to an exemplary embodiment, the first and second masks M1 and M2 may not be removed, and the first and second masks M1 and M2 may be removed after an additional process is performed.

According to exemplary embodiments, the side walls of the shallow trench ST1 may be divided into a first trench portion TP1 and a second trench portion TP2. The first trench portion TP1 may be a region having a higher height from the substrate 100 than the second trench portion TP2. In this case, the height refers to the height from the upper surface of the substrate 100 in the third direction D3. In addition, the first and second trench portions TP1 and TP2 may be divided on the basis of the center in the third direction D3 of both side walls of the shallow trench ST1. However, exemplary embodiments are not limited thereto. For example, in exemplary embodiments, the first and second trench portions TP1 and TP2 may be divided on the basis of any point. Further, although FIG. 16 illustrates that the side walls are divided into two parts, exemplary embodiments are not limited thereto, and the side walls may be divided into, for example, three or more parts.

According to exemplary embodiments, the first segregation layer SL1 may be formed by exposing the first and second fins F1 and F2 and the substrate 100 to an inhibitor plasma. The inhibitor plasma may create a passivated surface and may increase a nucleation wall of the deposited field insulating film. When the inhibitor plasma interacts with the material forming the field insulating film 200 in the shallow trench ST1, the lower part (e.g., the second trench portion TP2) of the shallow trench ST1 may be subjected to less plasma treatment than the upper part (e.g., the first trench portion TP1) of the shallow trench due to a shadowing effect of a geometrical structure. For example, inhibitor plasma treatment may be performed at the first trench portion TP1 more than at the second trench portion TP2.

According to exemplary embodiments, the first segregation layer SL1 may be formed by exposing the first fin F1, the second fin F2 and the substrate 100 to the inhibitor plasma during a first section.

According to exemplary embodiments, molecular nitrogen ($N_2$) may be used as a source gas for the inhibitor plasma. As another example, the source gas of the inhibitor plasma may include at least one of, for example, molecular nitrogen ($N_2$), argon (Ar), helium (He), molecular hydrogen ($H_2$), ammonia ($NH_3$) or a combination thereof.

According to exemplary embodiments, the upper parts of the first and second fins F1 and F2 may be subjected to more plasma treatment than the second trench portion TP2. According to an exemplary embodiment, the upper parts of the first and second fins F1 and F2 may be subjected to the same plasma treatment as the first trench portion TP1.

According to exemplary embodiments, the lower surface of the shallow trench ST1 may be subjected to the same or less plasma treatment than the second trench portion TP2. According to an exemplary embodiment, the plasma treatment may not be performed on the lower surface of the shallow trench ST1.

Figure 17:
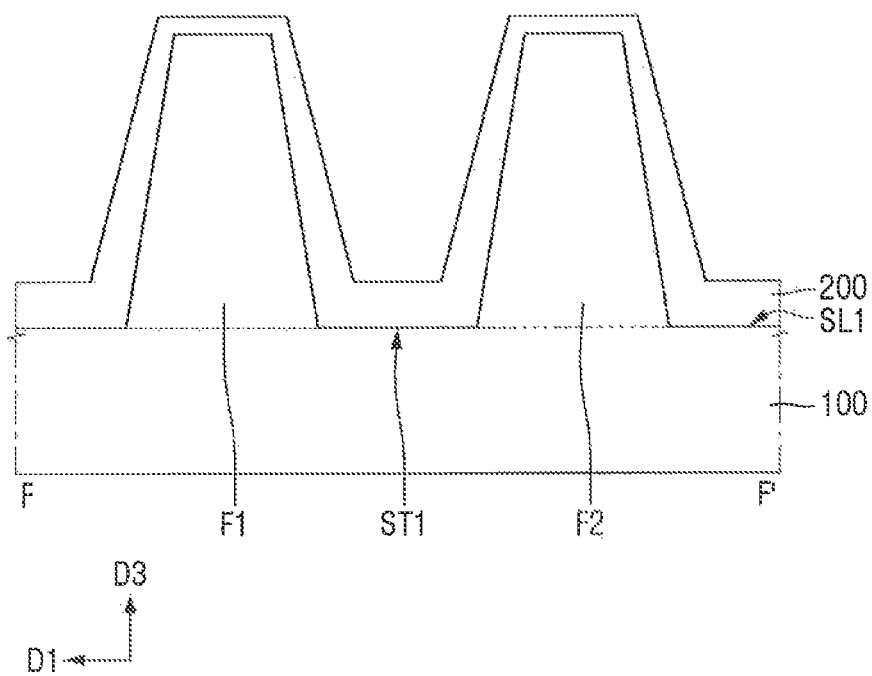

Subsequently, referring to FIG. 17, a first atomic layer deposition (ALD) cycle may be performed on the first segregation layer SL1. For example, the field insulating film 200 may be formed on the first segregation layer SL1. As illustrated, the field insulating film 200 may be thicker on the second trench portion TP2 of the shallow trench ST1 and the lower surface of the shallow trench ST1 in which the plasma treatment is not performed or the relatively less low plasma treatment is performed, than on the upper surfaces of the first and second fins F1 and F2 and the first trench portion TP1 of the shallow trench ST1 in which more plasma treatment is performed.

In describing exemplary embodiments of the present inventive concept, it is described that the segregation layer SL1 is formed, e.g., the inhibitor plasma treatment is performed, prior to performing the ALD cycle for deposition of the field insulating film 200. However, exemplary embodiments are not limited thereto. For example, in exemplary embodiments, the segregation layer SL1 is not formed prior to performing the first ALD cycle (or deposition of the first field insulating film 200), and the segregation layer SL1 may be formed after at least one ALD cycle is performed.

Figure 18:
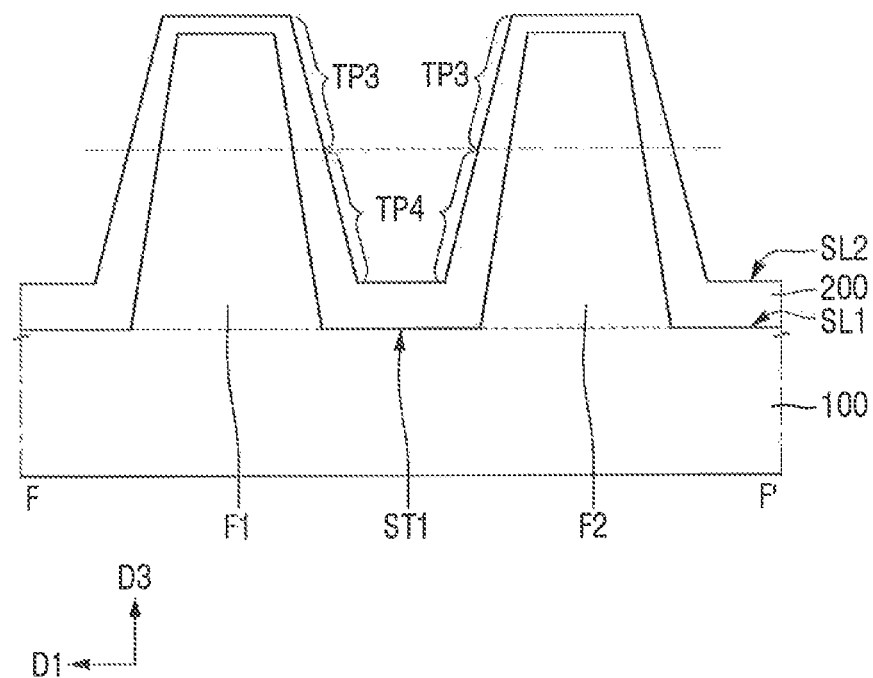

Subsequently, referring to FIG. 18, a second segregation layer SL2 may be formed on the field insulating film 200.

According to exemplary embodiments, both side walls of the field insulating film 200 formed between the first and second fins F1 and F2 may be divided into a third trench portion TP3 and a fourth trench portion TP4. The third trench portion TP3 may be a region having a higher height from the substrate 100 than the fourth trench portion TP4. The third and fourth trench portions TP3 and TP4 may be divided on the basis of the center in the third direction D3 of the region of the shallow trench ST1 in which the field insulating film 200 is not formed. However, exemplary embodiments of the present inventive concept are not limited thereto, and the third and fourth trench portions TP3 and TP4 may be divided on the basis of any point. Further, although FIG. 18 illustrates that the third and fourth trench portions TP3 and TP4 are divided into two parts, the third and fourth trench portions TP3 and TP4 may be divided into, for example, three or more parts.

According to exemplary embodiments, the second segregation layer SL2 may be formed by exposing the field insulating film 200 to an inhibitor plasma. The inhibitor plasma may generate a passivated surface and increase the nucleation wall of the deposited field insulating film. When the inhibitor plasma interacts with the material forming the field insulating film in the shallow trench ST1, the lower part (e.g., the fourth trench portion TP4) of the shallow trench ST1 may be subjected to less plasma treatment than the upper part (e.g., the third trench portion TP3) of the shallow trench ST1 due to the shadowing effect of the geometrical structure. For example, inhibitor plasma treatment may be performed in the third trench portion TP3 more than in the fourth trench portion TP4.

According to exemplary embodiments, the second segregation layer SL2 may be formed by exposing the field insulating film 200 to the inhibitor plasma during a second section. According to exemplary embodiments, the second section may be the same as or different from the first section. For example, the time during which the inhibitor plasma is exposed to the substrate 100 or the field insulating film 200 may be applied equally or differently for each cycle.

Figure 19:
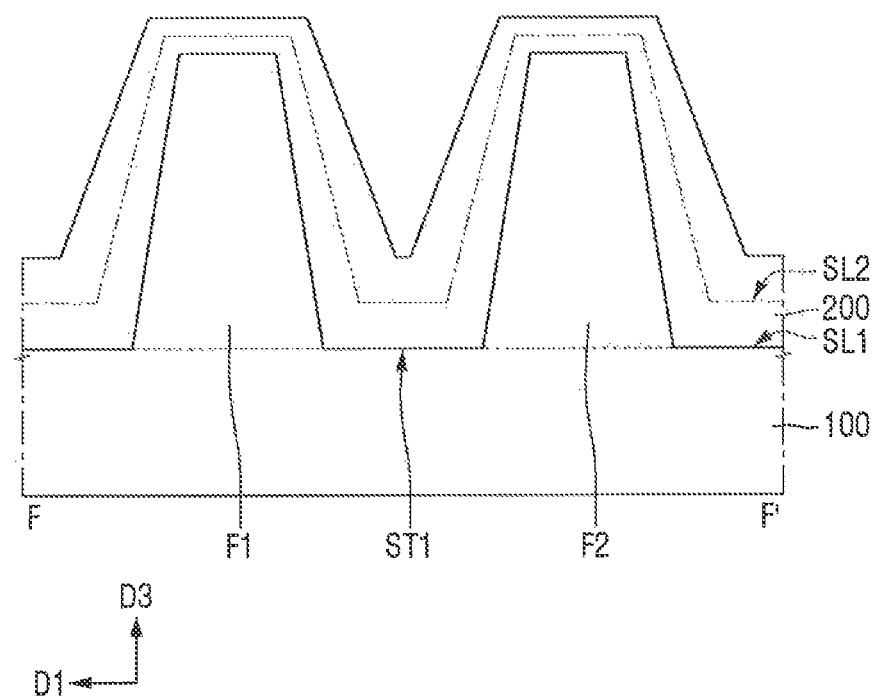

Referring to FIG. 19, a second ALD cycle may be performed on the second segregation layer SL2. For example, the field insulating film 200 may be formed on the second segregation layer SL2. As illustrated, the field insulating film 200 may be thicker on the fourth trench portion TP4 and the lower surface of the shallow trench ST1 in which the plasma treatment is not performed or relatively less plasma treatment is performed, than on the upper surfaces of the first and second fins F1 and F2 and the third trench portion TP3 on which more plasma treatment is performed.

Figure 20:
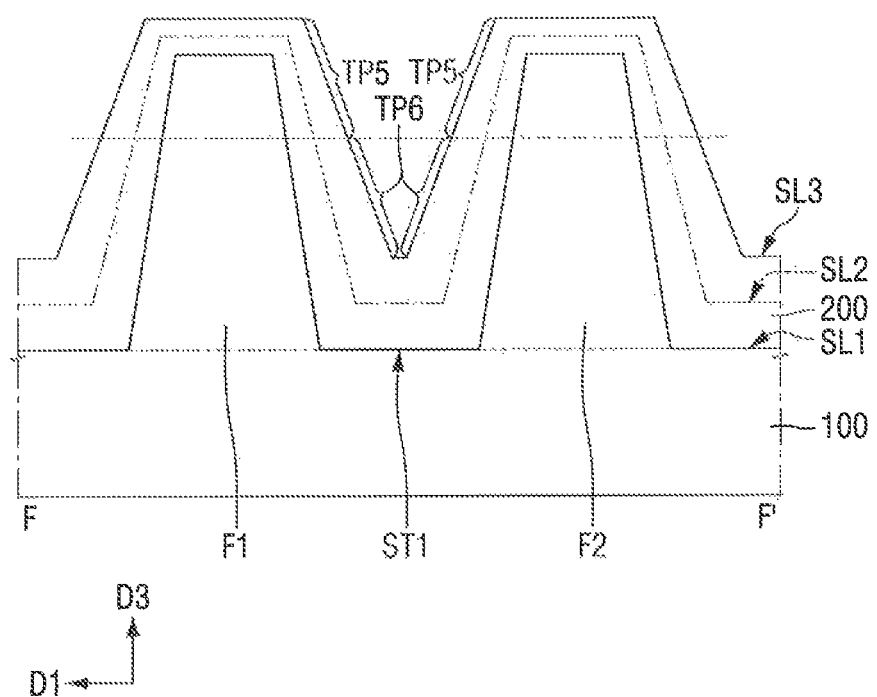

Referring to FIG. 20, a third segregation layer SL3 may be formed on the field insulating film 200.

According to exemplary embodiments, both side walls of the field insulating film 200 formed between the first and second fins F1 and F2 may be divided into a fifth trench portion TP5 and a sixth trench portion TP6. The fifth trench portion TP5 may be a region having a higher height from the substrate 100 than the sixth trench portion TP6. Further, the fifth and sixth trench portions TP5 and TP6 may be divided on the basis of the center in the third direction D3 of the region of the shallow trench ST1 in which the field insulating film 200 is not formed. However, exemplary embodiments are not limited thereto. For example, in exemplary embodiments, the fifth and sixth trench portions TP5 and TP6 may be divided on the basis of any point. Further, although FIG. 20 illustrates that the fifth and sixth trench portions TP5 and TP6 are divided into two parts, exemplary embodiments are not limited thereto, and the fifth and sixth trench portions TP5 and TP6 may be divided into, for example, three or more parts.

According to exemplary embodiments, the third segregation layer SL3 may be formed by exposing the field insulating film 200 to the inhibitor plasma. The inhibitor plasma may generate a passivated surface and increase the nucleation wall of the deposited field insulating film. When the inhibitor plasma interacts with the material forming the field insulating film in the shallow trench ST1, the lower part (e.g., the sixth trench portion TP6) of the shallow trench ST1 may be subjected to less plasma treatment than the upper part (e.g., the fifth trench portion TP6) of the shallow trench ST1 due to the shadowing effect of the geometrical structure. For example, more inhibitor plasma treatment may be performed on the fifth trench portion TP5 than on the sixth trench portion TP6.

According to exemplary embodiments, the third segregation layer SL3 may be formed by exposing the field insulating film 200 to the inhibitor plasma during a third section. According to exemplary embodiments, the third section may be the same as or different from the first and second sections. For example, the time during which the inhibitor plasma is exposed to the substrate 100 or the field insulating film 200 may be applied equally or differently for each cycle.

Figure 21:
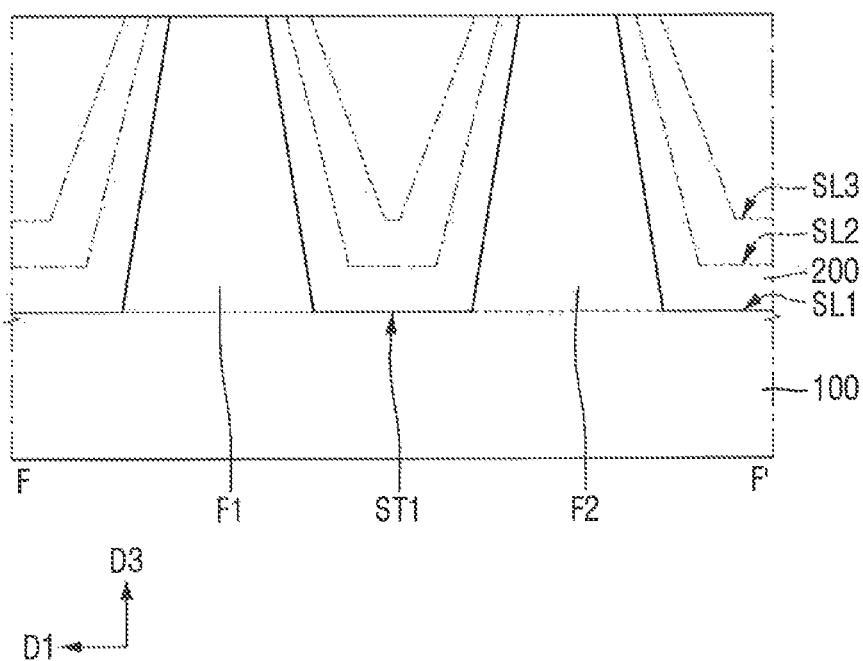
Figure 22:
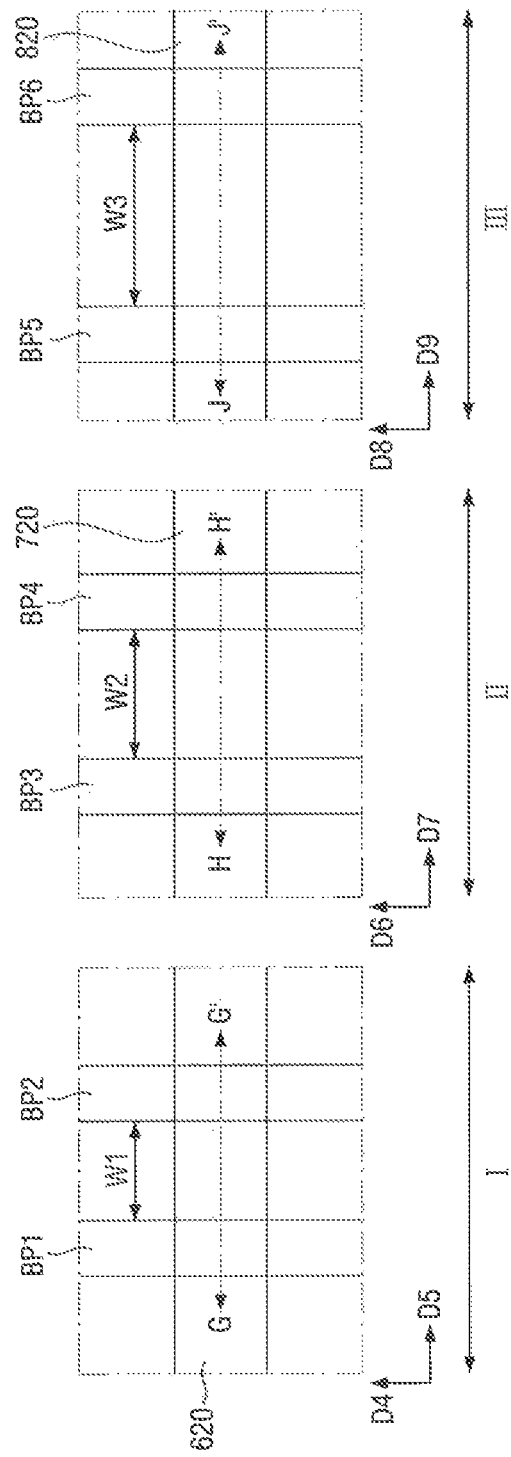
FIGS. 22 to 28 are diagrams provided to describe a semiconductor device according to exemplary embodiments of the present inventive concept.

Referring to FIG. 21, by performing the third ALD cycle, the field insulating film 200 may fill the shallow trench ST1. Thereafter, the upper surfaces of the first and second fins F1 and F2 may be exposed through a planarization process. Although the field insulating film 200 is illustrated as filling the shallow trench ST1 through three ALD cycles as an example, the number of times of performing the ALD cycle is not limited thereto. Although the segregation layer is formed between each ALD cycle, exemplary embodiments are not limited thereto.

According to an exemplary embodiment, the described process may be performed without removing the first and second masks M1 and M2. In this case, the upper surfaces of the first and second masks M1 and M2 may be exposed through the planarization process.

As illustrated, according to an exemplary embodiment of the present inventive concept, by forming a plurality of segregation layers SL1, SL2 and SL3 using a plurality of ALD cycles and the inhibitor plasma, the deposition in the upper end portion of the shallow trench ST1 is selectively suppressed, and the deposition is suppressed to be less (or proceeds without being suppressed) in the lower end portion of the shallow trench ST1. Thus, the bottom-up fill of the field insulating film 200 may be improved and the occurrence of a void or seam may be minimized or reduced.

The planarization process may be, for example, a chemical mechanical polish (CMP) process. The field insulating film 200 may be separated into the field insulating film defined by the plurality of fins through the planarization process.

Thereafter, a part of the upper part of the field insulating film 200 may be removed by an etching process. Therefore, as described above with reference to FIGS. 1 to 7, the field insulating film 200 in which the upper surface is formed in a shape of a brace may be formed.

Figure 23:
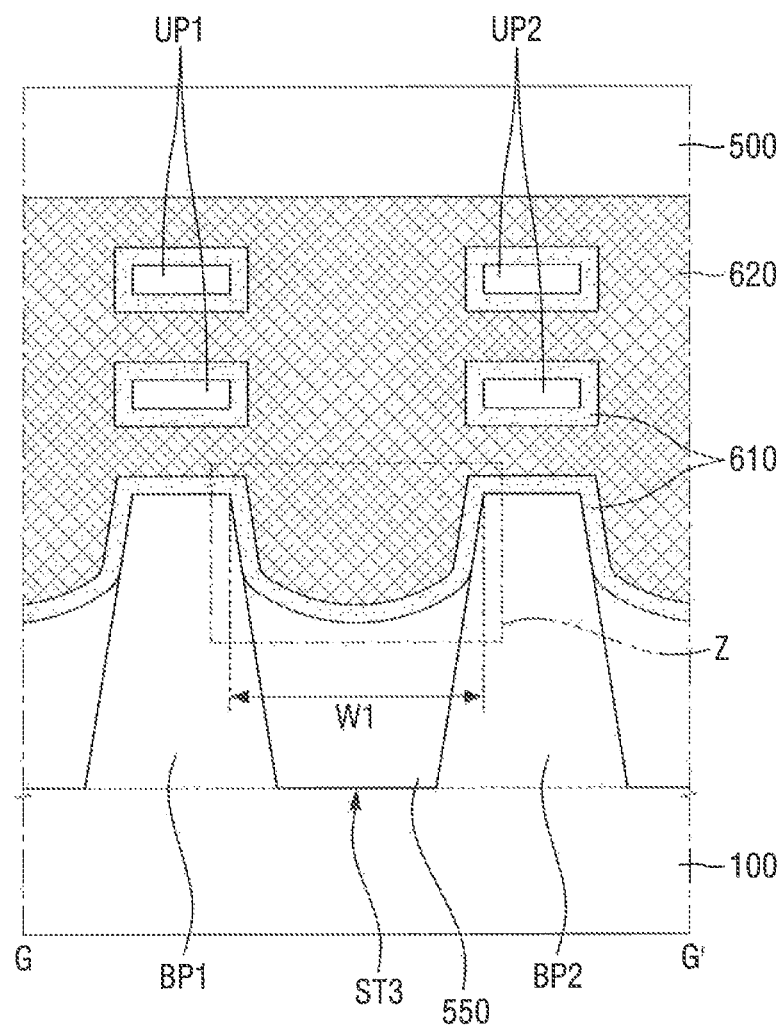
Figure 24:
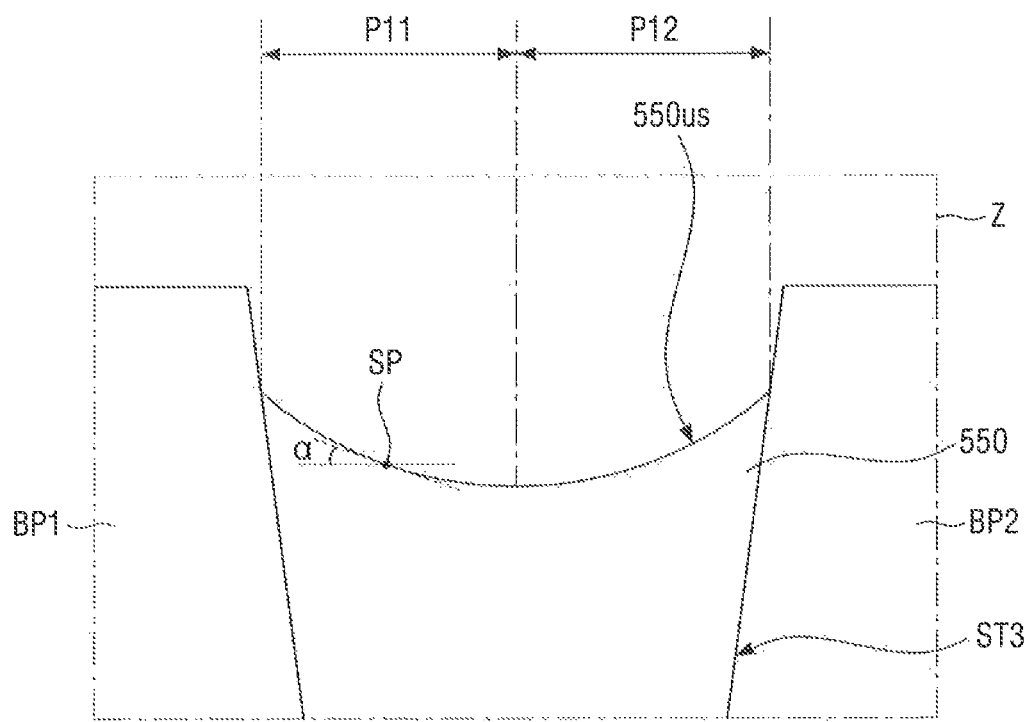
Figure 25:
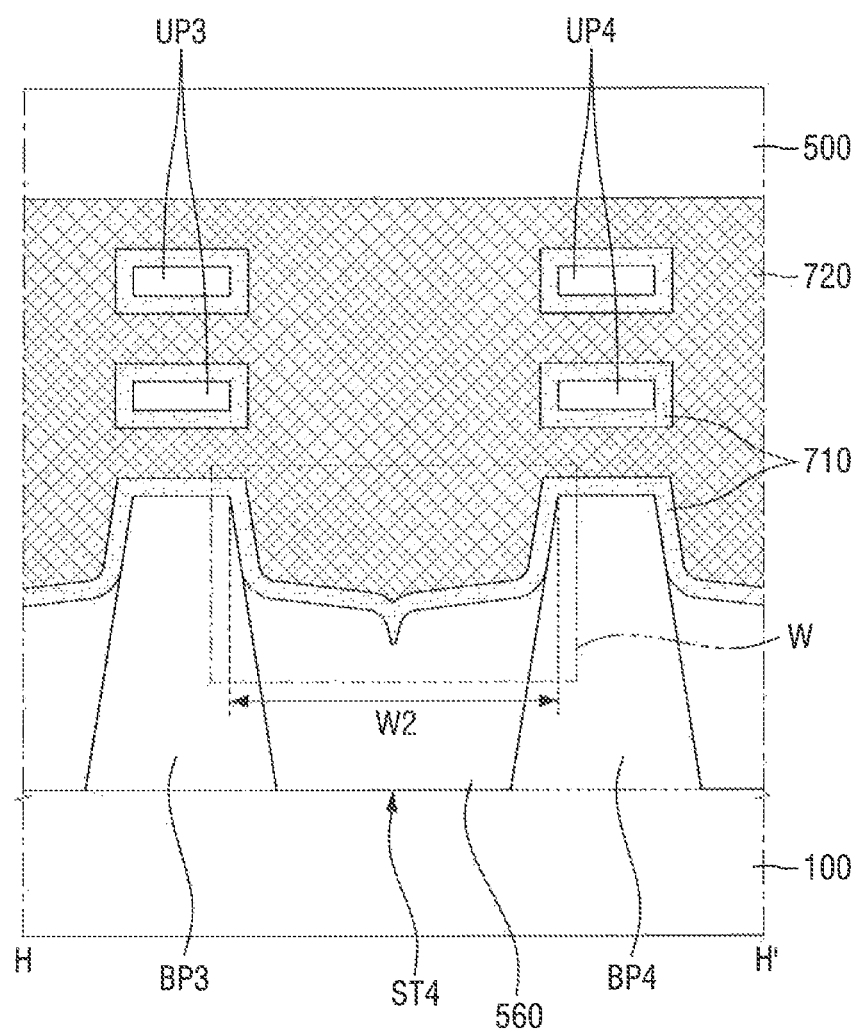
Figure 26:
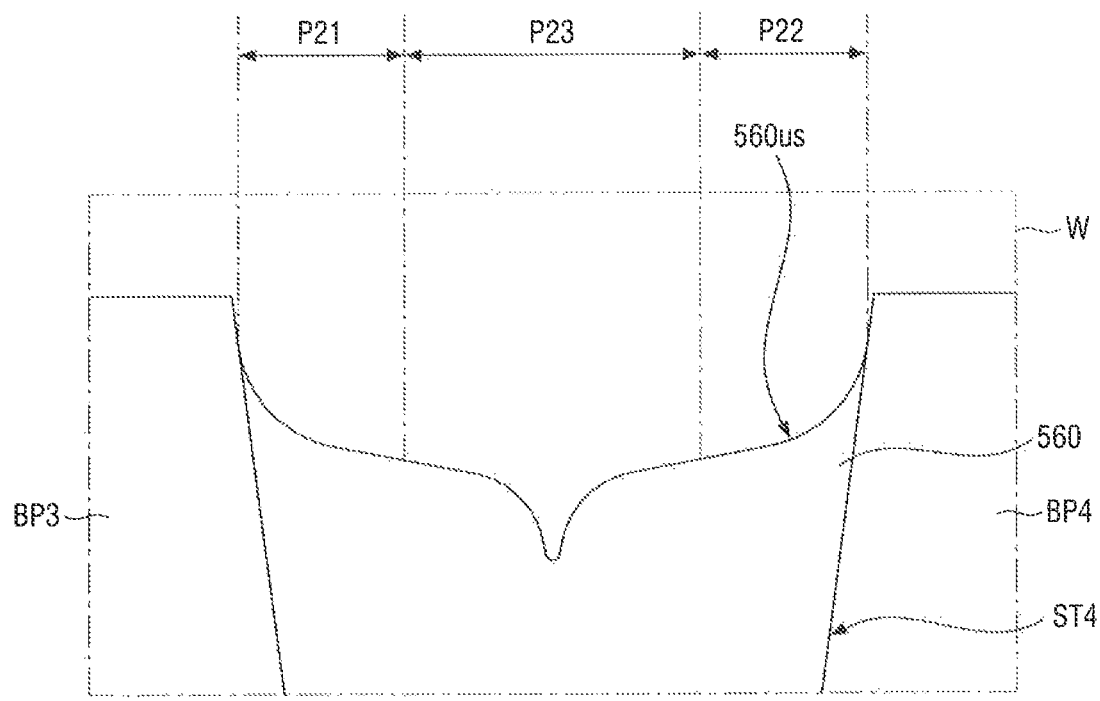
Figure 27:
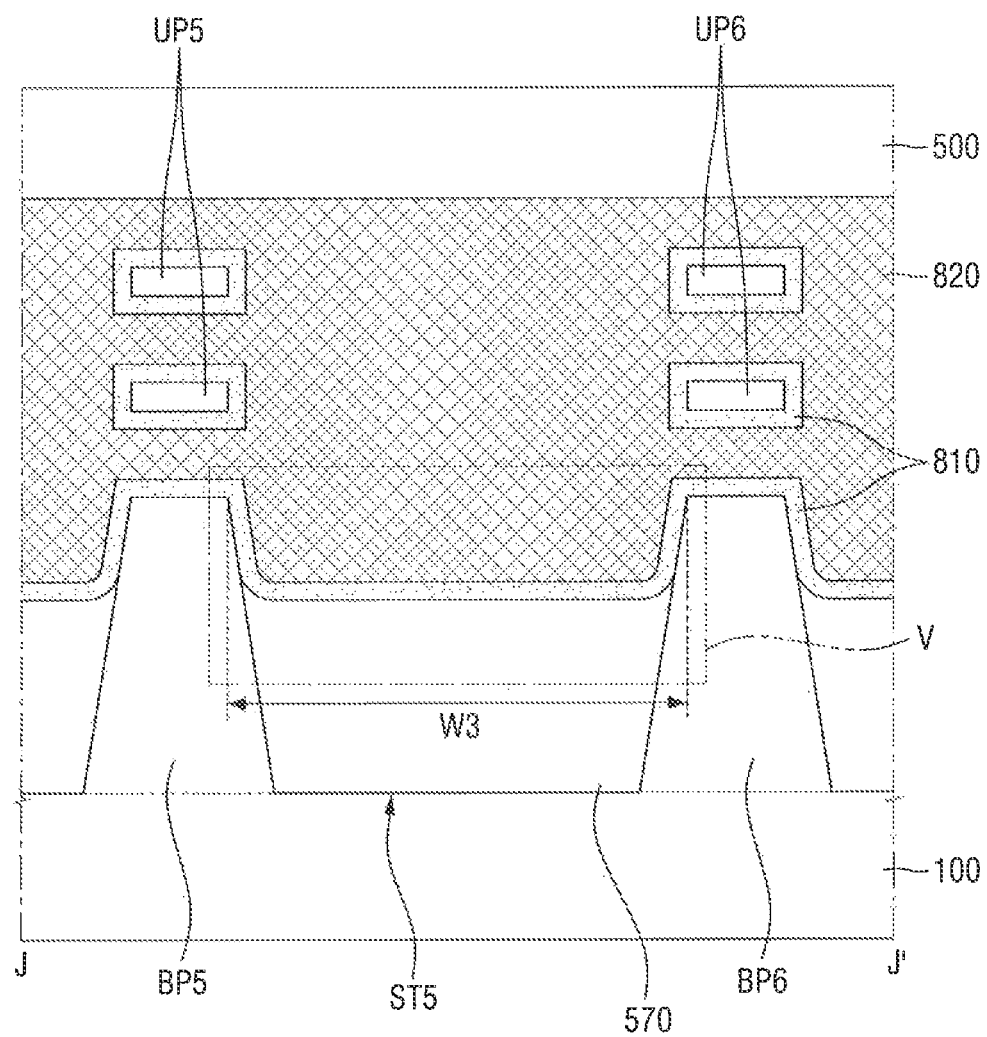
Figure 28:
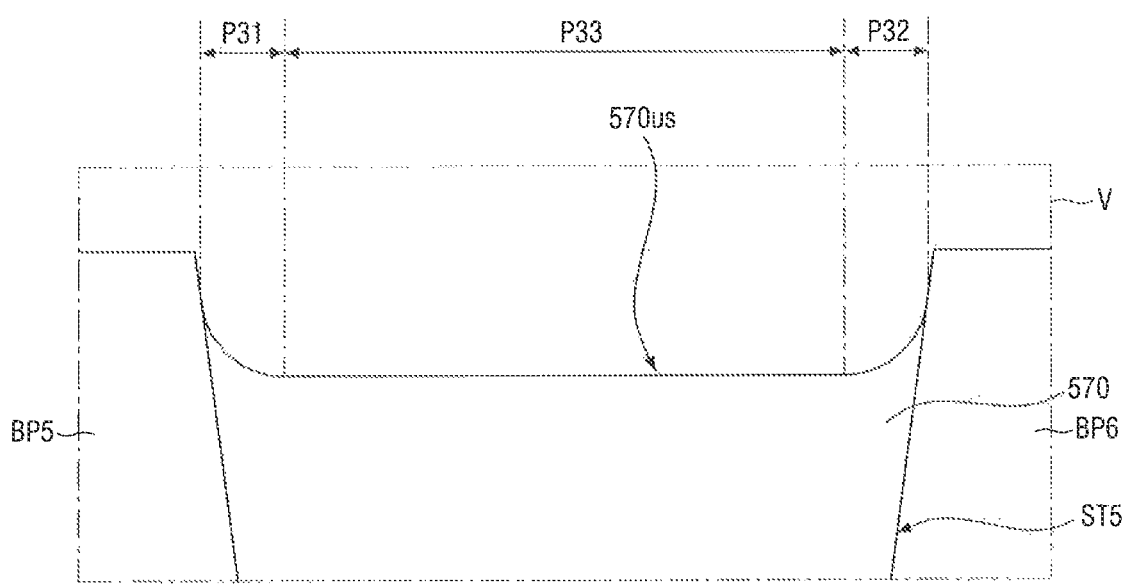

FIGS. 22 to 28 are diagrams provided to describe a semiconductor device according to exemplary embodiments of the present inventive concept. FIGS. 23, 25 and 27 are cross-sectional views taken along lines G-G', H-H' and J-J' of FIG. 22, respectively, according to exemplary embodiments of the present inventive concept. FIG. 24 is an enlarged view of area Z of FIG. 23 according to exemplary embodiments of the present inventive concept. FIG. 26 is an enlarged view of area W of FIG. 25 according to exemplary embodiments of the present inventive concept. FIG. 28 is an enlarged view of area V of FIG. 27 according to exemplary embodiments of the present inventive concept. For convenience of illustration, FIGS. 24, 26 and 28 do not show gate insulating films 610, 710 and 810 and gate electrodes 620, 720 and 820, respectively.

Referring to FIGS. 22 to 28, the semiconductor device according to exemplary embodiments may include a first field insulating film 550, a second field insulating film 560, and a third field insulating film 570.

The substrate 100 may include a first region I, a second region II, and a third region III. As an example, the first region I, the second region II, and the third region III may be regions that perform functions different from each other. As another example, two regions among the first region I, the second region II, and the third region III may be regions that perform the same function, and the other region may be a region that performs another function. As still another example, the first region I, the second region II, and the third region III may be regions that perform the same function.

A first lower pattern BP1 and a second lower pattern BP2 may be disposed in the first region I of the substrate. Each of the first lower pattern BP1 and the second lower pattern BP2 may extend lengthwise in a fourth direction D4. The first lower pattern BP1 and the second lower pattern BP2 may be separated by a third shallow trench ST3. On the basis of an upper surface of the first lower pattern BP1 and an upper surface of the second lower pattern BP2, the third shallow trench ST3 may have a first width W1 in a fifth direction D5. A first upper pattern UP1 may be disposed on the first lower pattern BP1 and spaced apart from the first lower pattern BP1. A second upper pattern UP2 may be disposed on the second lower pattern BP2 and spaced apart from the second lower pattern BP2. The first field insulating film 550 may fill at least part of the third shallow trench ST3.

The first gate electrode 620 and the first gate insulating film 610 may be disposed on the first field insulating film 550, the first lower pattern BP1, and the second lower pattern BP2. The first gate insulating film 610 may wrap around the first upper pattern UP1 and the second upper pattern UP2. The first gate electrode 620 is formed on the first gate insulating film 610 and may wrap around the first upper pattern UP1 and the second upper pattern UP2. The first gate electrode 620 extends in the fifth direction D5 and may intersect the first lower pattern BP1 and the second lower pattern BP2. Unlike the illustrated example, the first lower pattern BP1 and the second lower pattern BP2 may intersect the gate electrodes separated from each other according to exemplary embodiments.

A third lower pattern BP3 and a fourth lower pattern BP4 may be disposed in the second region II of the substrate. Each of the third lower pattern BP3 and the fourth lower pattern BP4 may extend lengthwise in a sixth direction D6. The third lower pattern BP3 and the fourth lower pattern BP4 may be separated by a fourth shallow trench ST4. On the basis of an upper surface of the third lower pattern BP3 and an upper surface of the fourth lower pattern BP4, the fourth shallow trench ST4 may have a second width W2 in a seventh direction D7. A third upper pattern UP3 is disposed on the third lower pattern BP3 and may be spaced part from the third lower pattern BP3. A fourth upper pattern UP4 is disposed on the fourth lower pattern BP4 and may be spaced apart from the fourth lower pattern BP4. The second field insulating film 560 may fill at least part of the fourth shallow trench ST4.

The second gate electrode 720 and the second gate insulating film 710 may be disposed on the second field insulating film 560, the third lower pattern BP3, and the fourth lower pattern BP4. The second gate insulating film 710 may wrap around the third upper pattern UP3 and the fourth upper pattern UP4. The second gate electrode 720 is formed on the second gate insulating film 710 and may wrap around the third upper pattern UP3 and the fourth upper pattern UP4. The second gate electrode 720 extends in the seventh direction D7 and may intersect the third lower pattern BP3 and the fourth lower pattern BP4. Unlike the illustrated example, the third lower pattern BP3 and the fourth lower pattern BP4 may intersect the gate electrodes separated from each other according to exemplary embodiments.

A fifth lower pattern BP5 and a sixth lower pattern BP6 may be disposed in the third region III of the substrate. Each of the fifth lower pattern BP5 and the sixth lower pattern BP6 may extend lengthwise in an eighth direction D8. The fifth lower pattern BP5 and the sixth lower pattern BP6 may be separated by a fifth shallow trench ST5. On the basis of an upper surface of the fifth lower pattern BP5 and an upper surface of the sixth lower pattern BP6, the fifth shallow trench ST5 may have a third width W3 in a ninth direction D9. A fifth upper pattern UP5 is disposed on the fifth lower pattern BP5 and may be spaced part from the fifth lower pattern BP5. A sixth upper pattern UP6 is disposed on the sixth lower pattern BP6 and may be spaced apart from the sixth lower pattern BP6. The third field insulating film 550 may fill at least a part of the fifth shallow trench ST5.

The third gate electrode 820 and the third gate insulating film 810 may be disposed on the third field insulating film 570, the fifth lower pattern BP5, and the sixth lower pattern BP6. The third gate insulating film 810 may wrap around the fifth upper pattern UP5 and the sixth upper pattern UP6. The third gate electrode 820 is formed on the third gate insulating film 810 and may wrap around the fifth upper pattern UP5 and the sixth upper pattern UP6. The third gate electrode 820 extends in the ninth direction D9 and may intersect the fifth lower pattern BP5 and the sixth lower pattern BP6. Unlike the illustrated example, the fifth lower pattern BP5 and the sixth lower pattern BP6 may intersect the gate electrodes separated from each other according to exemplary embodiments.

Unlike the illustrated example, the transistors formed in the first to third regions I, II, III may be FINFETs according to exemplary embodiments.

In a semiconductor device according to exemplary embodiments of the present inventive concept, the second width W2 is greater than the first width W1 and smaller than the third width W3. The first to third field insulating films 550, 560 and 570 may include, for example, an oxide.

In FIG. 24, an upper surface 550us of the first field insulating film 550 may include a first portion P11 adjacent to the first lower pattern BP1, and a second portion P12 adjacent to the second lower pattern BP2. The first portion P11 of the upper surface 550us of the first field insulating film may be in contact with the second portion P12 of the upper surface 550us of the first field insulating film 550.

In the first portion P11 of the upper surface 550us of the first field insulating film 550, a slope of the upper surface 550us of the first field insulating film 550 may decrease as the upper surface 550us extends away from the first lower pattern BP1. In addition, in the second portion P12 of the upper surface 550us of the first field insulating film 550, a slope of the upper surface 550us of the first field insulating film 550 may decrease as the upper surface 550us extends away from the second lower pattern BP2.

For example, a slope α at an arbitrary point SP of the first portion P11 of the upper surface 550us of the first field insulating film 550 may be an angle formed by a tangent between the base line and the arbitrary point SP. Here, the base line may be a virtual line that connects the uppermost part of the first lower pattern BP1 and the uppermost part of the second lower pattern BP2. With movement from the first lower pattern BP1 to the second lower pattern BP2, the slope of the upper surface 550us of the first field insulating film 550 may gradually decrease and then gradually increase again.

In FIG. 26, an upper surface 560us of the second field insulating film 560 may include a first portion P21 adjacent to the third lower pattern BP3, a second portion P22 adjacent to the fourth lower pattern BP4, and a third portion P23 between the first portion P21 and the second portion P22.

In the first portion P21 of the upper surface 560us of the second field insulating film 560, the slope of the upper surface 560us of the second field insulating film 560 may decrease as the second field insulating film 560 extends away from the third lower pattern BP3. In addition, in the second portion P22 of the upper surface 560us of the second field insulating film 560, the slope of the upper surface 560us of the second field insulating film 560 may decrease as the second field insulating film 560 extends away from the fourth lower pattern BP4. In the third portion P23 of the upper surface 560us of the second field insulating film 560, the slope of the upper surface 560us of the second field insulating film 560 may gradually increase and then may gradually decrease as the second field insulating film 560 extends away from the third lower pattern BP3.

For example, the upper surface 560us of the second field insulating film 560 may have a shape of a brace (}) indented toward the substrate 100. The description thereof may be the same as that described above with reference to FIGS. 3 and 4.

In FIG. 28, an upper surface 570us of the third field insulating film 570 may include a first portion P31 adjacent to the fifth lower pattern BP5, a second portion P32 adjacent to the sixth lower pattern BP6, and a third portion P33 between the first portion P31 and the second portion P32.

In the first portion P31 of the upper surface 570us of the third field insulating film 570, the slope of the upper surface 570us of the third field insulating film 570 may decrease as the third field insulating film 570 extends away from the fifth lower pattern BP5. In addition, in the second portion P32 of the upper surface 570us of the third field insulating film 570, the slope of the upper surface 570us of the third field insulating film 570 may decrease as the third field insulating film 570 extends away from the sixth lower pattern BP6. In the third portion P33 of the upper surface 570us of the third field insulating film 570, the slope of the upper surface 570us of the third field insulating film 570 may be constant. For example, the third portion P33 of the upper surface 570us of the third field insulating film 570 may be a plane (e.g., the third portion P33 of the upper surface 570us of the third field insulating film 570 may be substantially flat).

Figure 29:
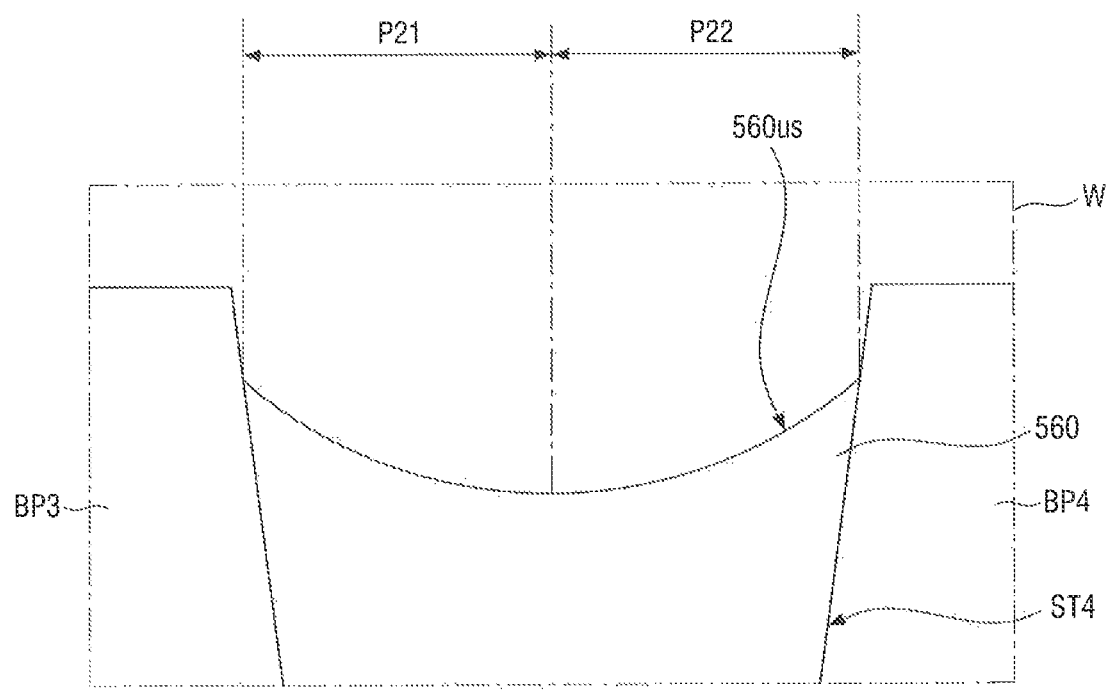
FIG. 29 is a diagram provided to describe a semiconductor device according to exemplary embodiments of the present inventive concept.
Figure 30:
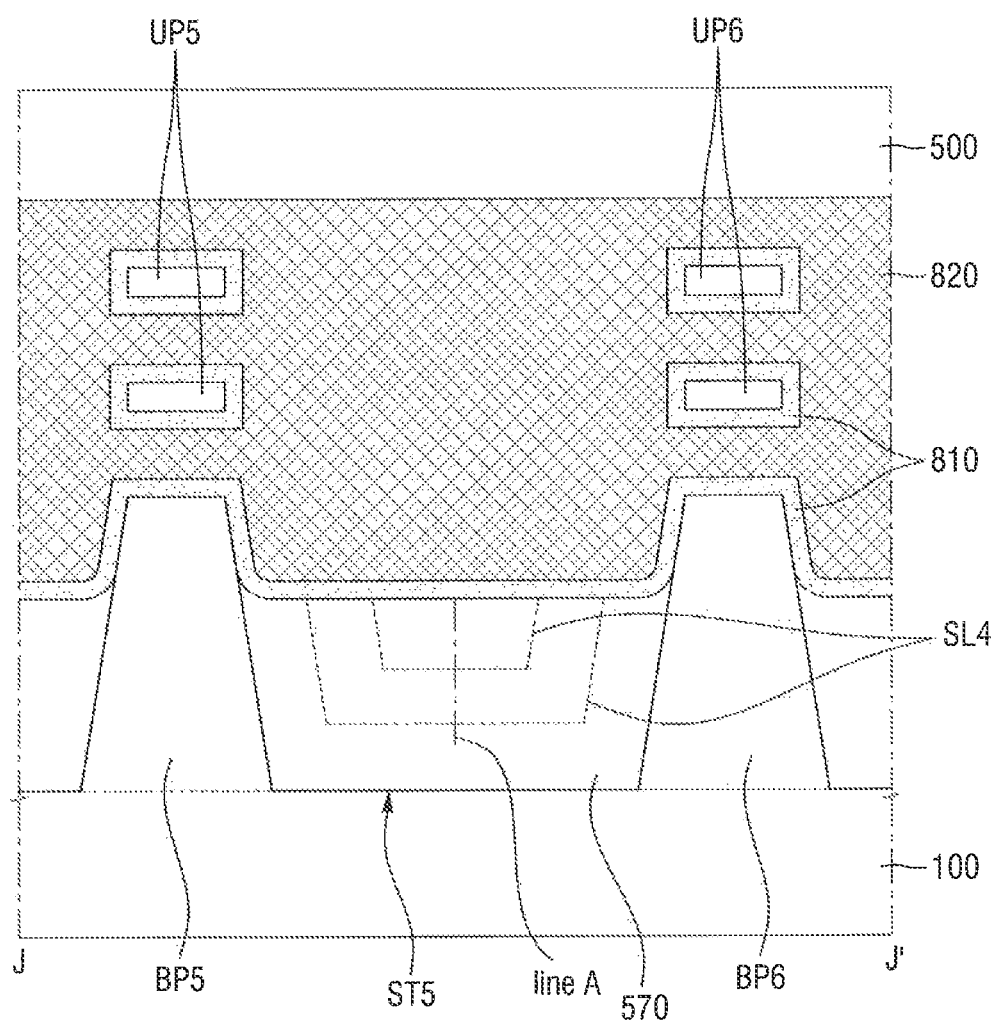
FIGS. 30 and 31 are diagrams provided to describe a semiconductor device according to exemplary embodiments of the present inventive concept.
Figure 31:
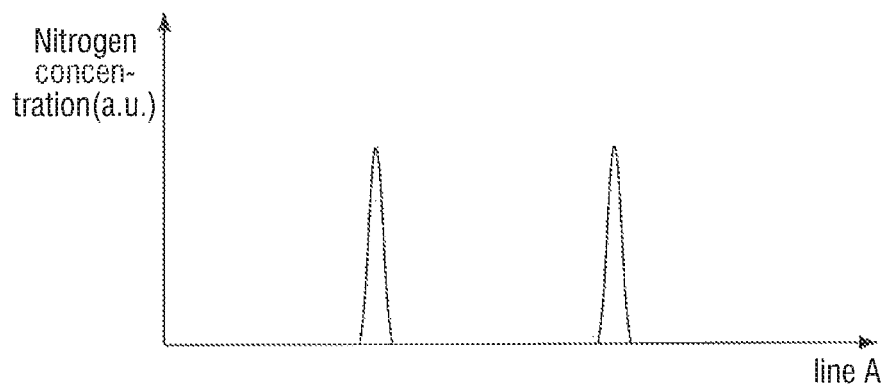

FIG. 29 is a diagram provided to describe a semiconductor device according to exemplary embodiments of the present inventive concept. FIGS. 30 and 31 are diagrams provided to describe a semiconductor device according to exemplary embodiments of the present inventive concept. For convenience of explanation, differences from exemplary embodiments described with reference to FIGS. 22 to 28 will be primarily described, and a further description of elements and aspects previously described may be omitted. FIG. 29 is an enlarged view of area W of FIG. 25 according to exemplary embodiments of the present inventive concept, and for convenience of illustration, does not show the corresponding gate insulating film and the gate electrode. FIG. 30 is a cross-sectional view taken along line J-J' of FIG. 22 according to exemplary embodiments of the present inventive concept. FIG. 31 is a schematic graph showing the nitrogen concentration along line A of FIG. 30 according to exemplary embodiments of the present inventive concept.

Referring to FIG. 29, in a semiconductor device according to exemplary embodiments of the present inventive concept, the first portion P21 of the upper surface 560us of the second field insulating film 560 may be in contact with the second portion P22 of the upper surface 560us of the second field insulating film 560. From the third lower pattern BP3 to the fourth lower pattern BP4, the slope of the upper surface 560us of the second field insulating film 560 may gradually decrease and then may gradually increase again.

Referring to FIGS. 30 and 31, in a semiconductor device according to exemplary embodiments of the present inventive concept, the third field insulating film 570 may include at least one or more fourth separation layers SL4 disposed in the third field insulating film 570.

The fourth separation layer SL4 may extend along the side wall and the bottom surface of the fifth shallow trench ST5. The fourth separation layer SL4 may include a portion substantially parallel to the upper surface of the substrate 100, a portion substantially parallel to the side wall of the fifth lower pattern BP5, and a portion substantially parallel to the side wall of the sixth lower pattern BP6. In the semiconductor device according to exemplary embodiments, the fourth separation layer SL4 is not in contact with the fifth lower pattern BP5 and the sixth lower pattern BP6. Each fourth separation layer SL4 may be spaced apart from each other. An oxide may be disposed between adjacent fourth separation layers SL4. The fourth separation layer SL4 may be a portion formed through the inhibitor plasma described with reference to FIGS. 13 to 21. The fourth separation layer SL4 may contain nitrogen. In FIG. 30, two fourth separation layers SL4 are formed. However, exemplary embodiments of the present inventive concept are not limited thereto.

As an example, the second field insulating film 560 may not include a separation layer disposed in the second field insulating film 560. As another example, the second field insulating film 560 may include the separation layer disposed in the second field insulating film 560.

The first field insulating film 550 does not include the separation layer.

Figure 32:
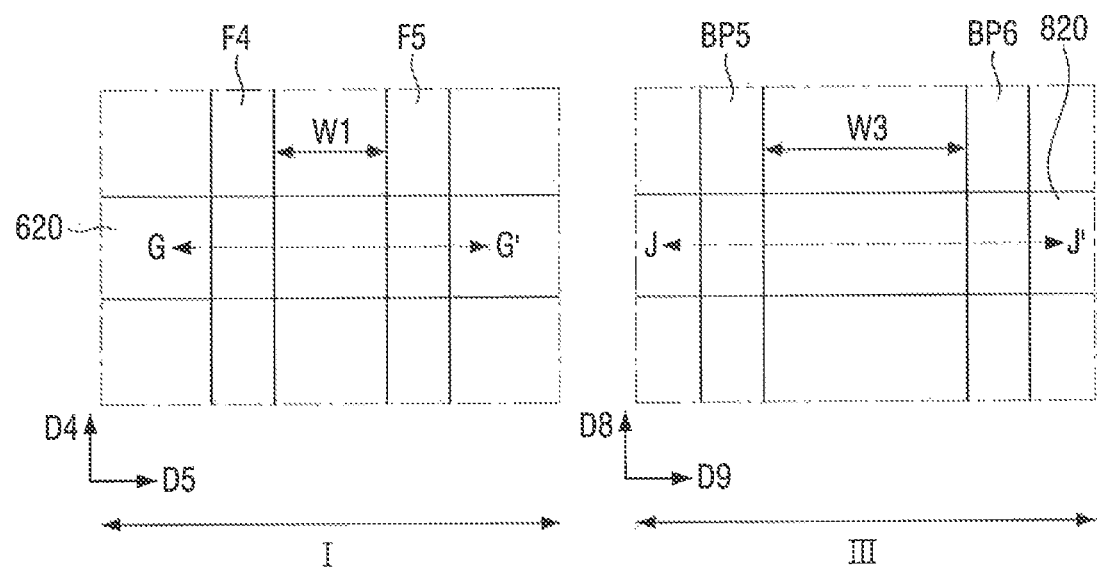
FIGS. 32 and 33 are diagrams provided to describe a semiconductor device according to exemplary embodiments of the present inventive concept.
Figure 33:
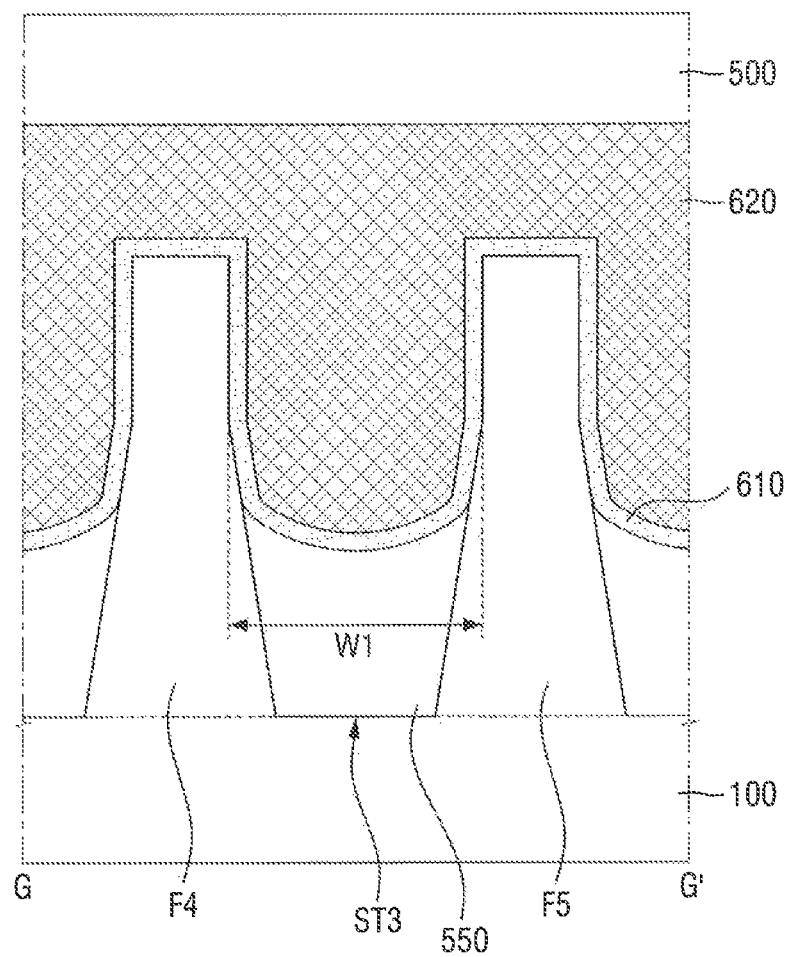

FIGS. 32 and 33 are diagrams provided to describe a semiconductor device according to exemplary embodiments of the present inventive concept. For convenience of explanation, differences from exemplary embodiments described with reference to FIGS. 22 to 28 will be primarily described, and a further description of elements and aspects previously described may be omitted. The description of the third region III of FIG. 32 may be substantially the same as that described with reference to FIGS. 22, 27, and 28. In FIG. 32, the second region II of FIG. 22 may be omitted.

Referring to FIGS. 32 and 33, in a semiconductor device according to exemplary embodiments, a fourth fin F4 and a fifth fin F5 spaced apart from each other in the fifth direction D5 may be disposed in the first region I. A FINFET may be formed in the first region I, and a transistor which uses a nanosheet or a nanowire as a channel may be formed in the third region III.

The upper surface of the first field insulating film 550 disposed between the fourth fin F4 and the fifth fin F5 may have, for example, a shape as illustrated in FIG. 24.

In FIG. 27, it is assumed that the fifth shallow trench ST5 has a third width W3 at the first height on the basis of the bottom surface of the fifth shallow trench ST5. A first width W1 of the third shallow trench ST3 may be a width measured at the first height from the bottom surface of the third shallow trench ST3.

Figure 34:
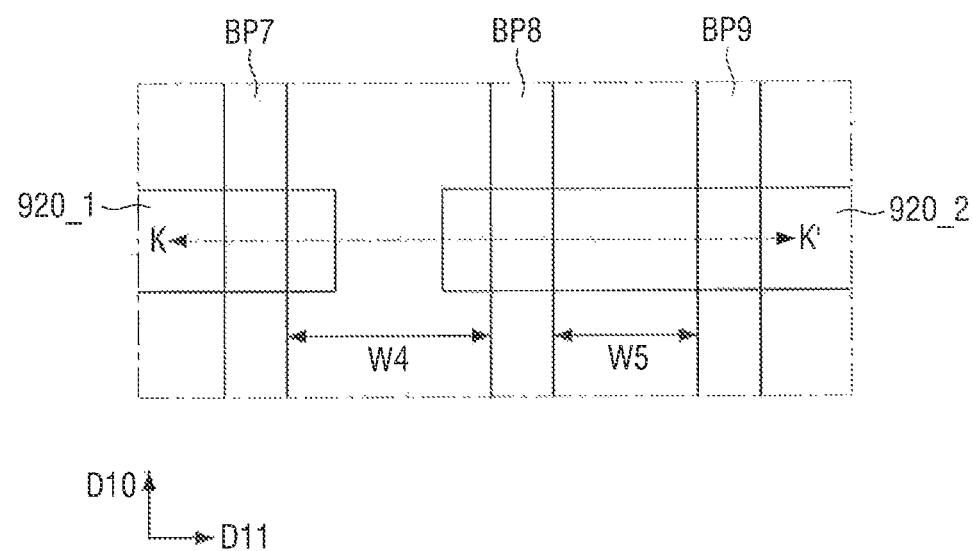
FIGS. 34 and 35 are diagrams provided to describe a semiconductor device according to exemplary embodiments of the present inventive concept.
Figure 35:
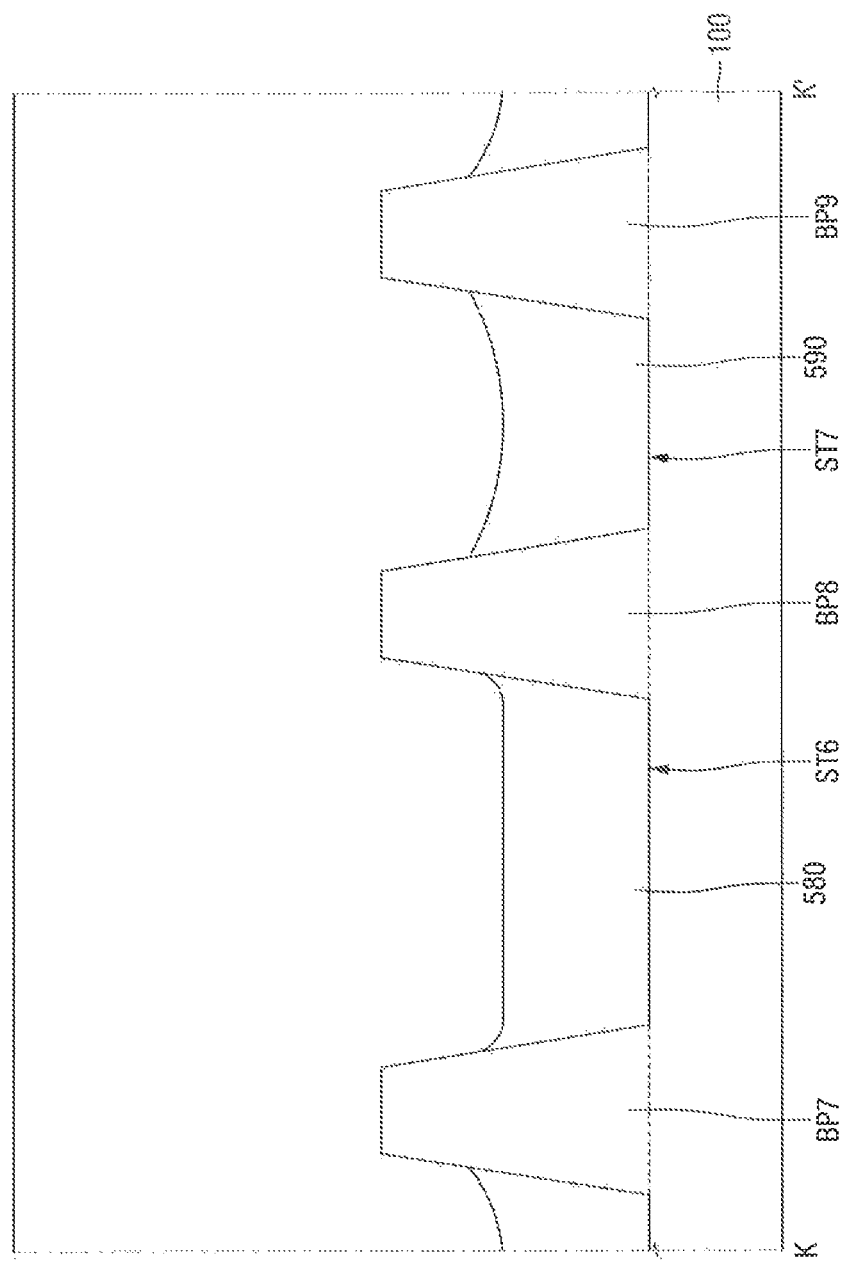

FIGS. 34 and 35 are diagrams for explaining the semiconductor device according to exemplary embodiments of the present inventive concept. For reference, FIG. 35 is a cross-sectional view taken along the line K-K' of FIG. 34. FIG. 35 shows only lower patterns BP7, BP8 and BP9, a fourth field insulating film 580, and a fifth field insulating film 590.

Referring to FIGS. 34 and 35, a semiconductor device according to exemplary embodiments of the present inventive concept may include a fourth field insulating film 580 and a fifth field insulating film 590.

A seventh lower pattern BP7, an eighth lower pattern BP8, and a ninth lower pattern BP9 may extend lengthwise in a tenth direction D10, respectively. For example, the seventh lower pattern BP7, the eighth lower pattern BP8, and the ninth lower pattern BP9 may be disposed in an SRAM region.

A fourth gate electrode 920_1 and a fourth gate electrode 920_2 may extend in an eleventh direction D11, respectively. Although the fourth gate electrode 920_1 may intersect the seventh lower pattern BP7, and the fourth gate electrode 920_2 may intersect the eighth lower pattern BP8 and the ninth lower pattern BP9, exemplary embodiments are not limited thereto. For example, in exemplary embodiments, the fourth gate electrode 920_1 may intersect the seventh lower pattern BP7 and the eighth lower pattern BP8, and the fourth gate electrode 920_2 may intersect the ninth lower pattern BP9. Unlike the illustrated example, in exemplary embodiments, the fourth gate electrode 920_1 and the fourth gate electrode 920_2 may be directly connected to each other.

For example, the fourth gate electrode 920_1 and the fourth gate electrode 920_2 may wrap around at least one or more upper patterns as shown in FIGS. 23, 25 and 27.

The seventh lower pattern BP7 and the eighth lower pattern BP8 may be separated by the sixth shallow trench ST6. On the basis of the upper surface of the seventh lower pattern BP7 and the upper surface of the eighth lower pattern BP8, the sixth shallow trench ST6 may have a fourth width W4 in the eleventh direction D11. The eighth lower pattern BP8 and the ninth lower pattern BP9 may be separated by the seventh shallow trench ST7. On the basis of the upper surface of the eighth lower pattern BP8 and the upper surface of the ninth lower pattern BP9, the seventh shallow trench ST7 may have a fifth width W5 in the eleventh direction D11. In a semiconductor device according to exemplary embodiments of the present inventive concept, the fourth width W4 is greater than the fifth width W5. The fourth field insulating film 580 may fill at least a part of the sixth shallow trench ST6. The fifth field insulating film 590 may fill at least a part of the seventh shallow trench ST7.

In a semiconductor device according to exemplary embodiments of the present inventive concept, the upper surface of the fourth field insulating film 580 may have a shape of the upper surface 570us of the third field insulating film 570 described with reference to FIG. 28. The upper surface of the fifth field insulating film 590 may have a shape of the upper surface 550us of the first field insulating film 550 described with reference to FIG. 24 or a shape of the upper surface 560us of the second field insulating film 560 described with reference to FIG. 29.

FIGS. 36 to 40 are intermediate stage diagrams provided to describe a method of manufacturing a semiconductor device according to exemplary embodiments of the present inventive concept.

Figure 36:
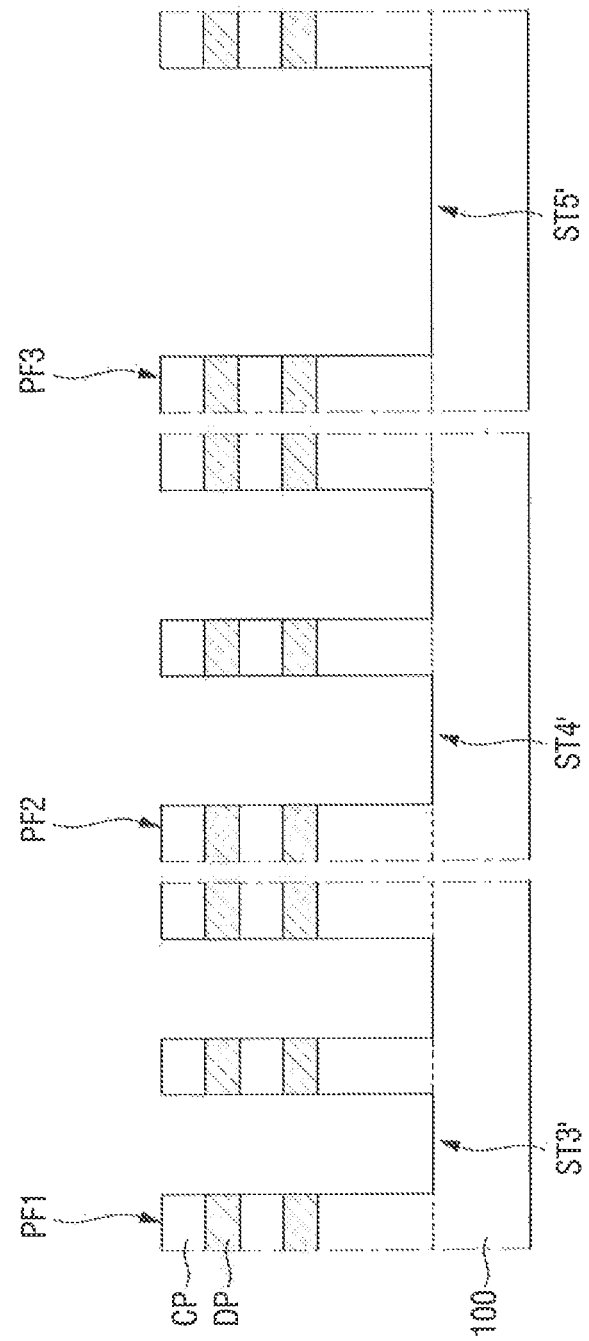
FIGS. 36 to 40 are intermediate stage diagrams provided to describe a method for manufacturing a semiconductor device according to exemplary embodiments of the present inventive concept.

Referring to FIG. 36, a first pre-pattern PF1, a second pre-pattern PF2, and a third pre-pattern PF3 may be formed on the substrate 100.

The first pre-pattern PF1 may be separated by a third shallow trench ST3'. The second pre-pattern PF2 may be separated by a fourth shallow trench ST4'. The third pre-pattern PF3 may be separated by a fifth shallow trench ST5'. Each of the first to third pre-patterns PF1, PF2 and PF3 may include a channel pattern CP and a dummy pattern DP. The channel pattern CP may be the upper pattern of FIGS. 23, 25 and 27.

Figure 37:
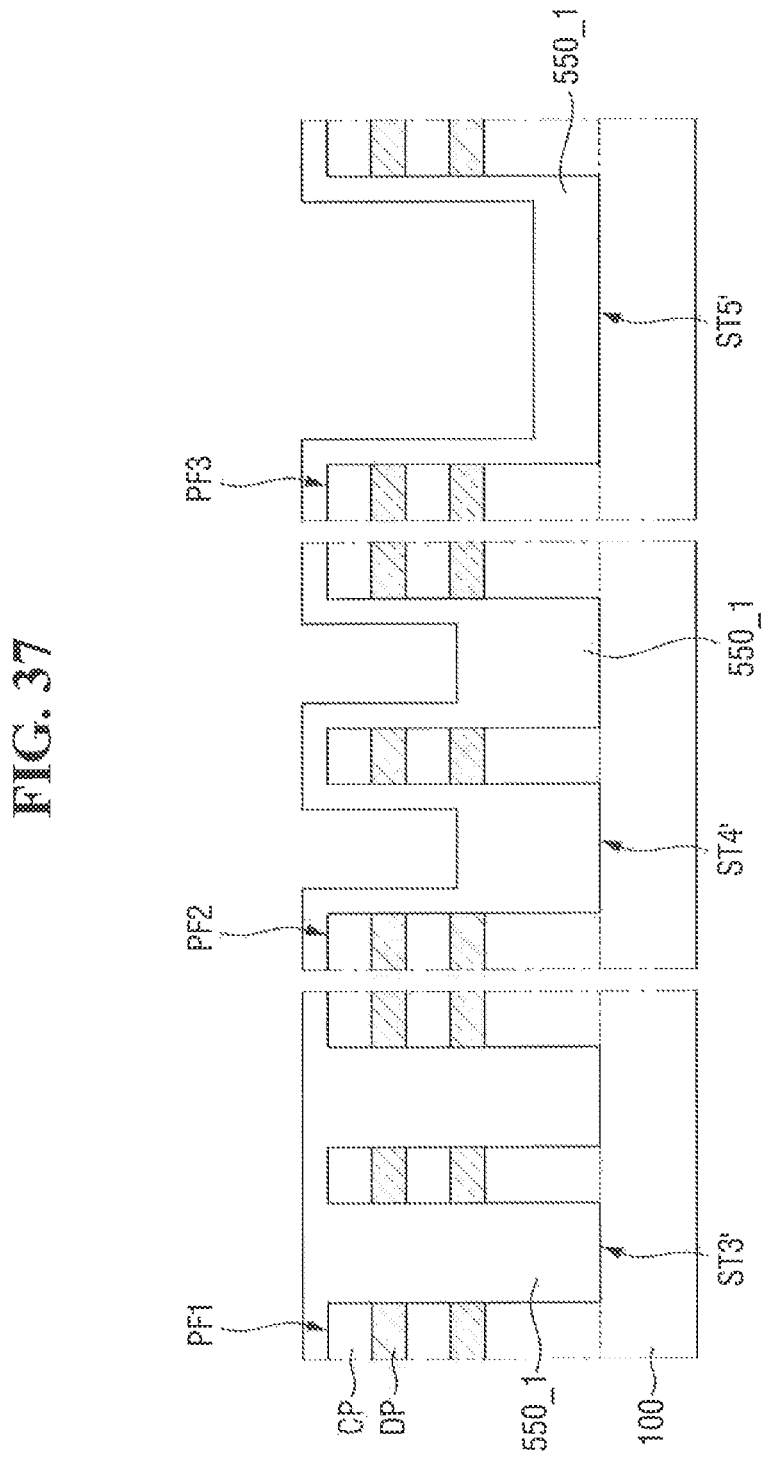

Referring to FIG. 37, a first pre-field insulating film 550_1 is formed on the substrate 100. The first pre-field insulating film 550_1 may include an oxide.

The first pre-field insulating film 550_1 may entirely fill the third shallow trench ST3'. The first pre-field insulating film 550_1 may fill a part of the fourth and fifth shallow trenches ST4' and ST5'. The first pre-field insulating film 550_1 may be formed by, for example, a flowable CVD (FCVD) method.

Figure 38:
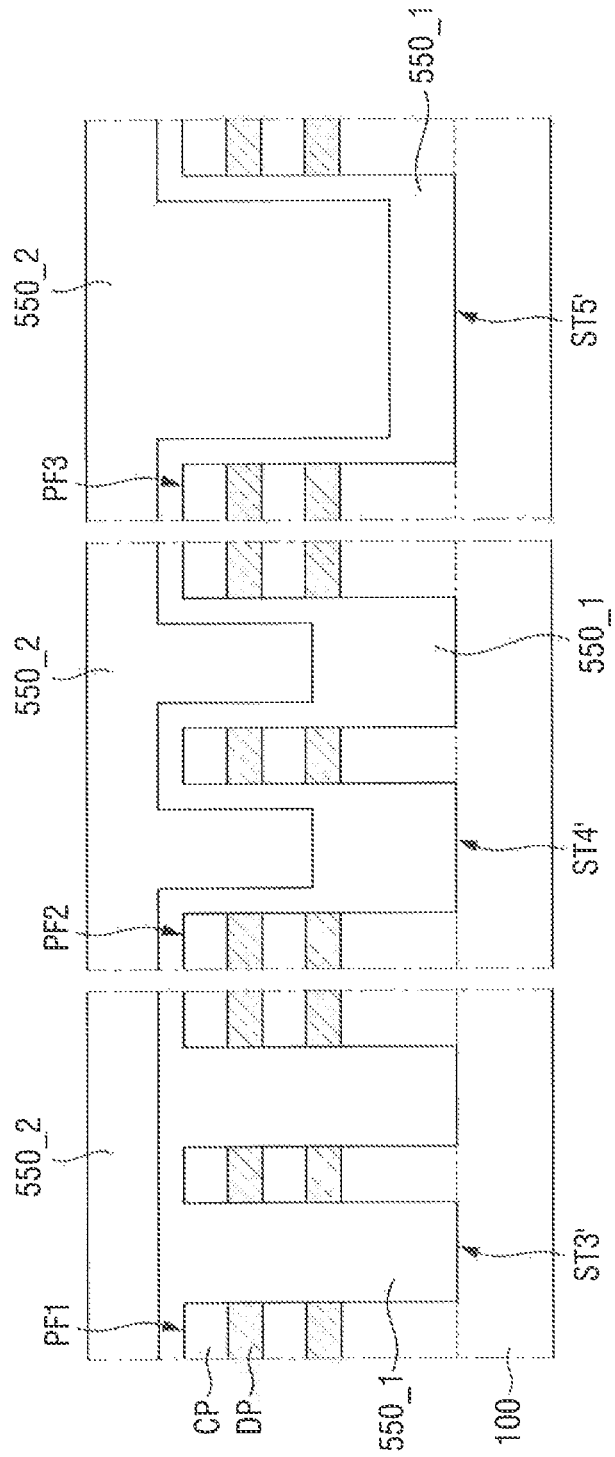

Referring to FIG. 38, a second pre-field insulating film 550_2 may be formed on the first pre-field insulating film 550_1. The second pre-field insulating film 550_2 may include an oxide. The second pre-field insulating film 550_2 may fill the rest of the fourth and fifth shallow trenches ST4' and ST5'. The third pre-field insulating film 550_2 may be formed by the method described with reference to FIGS. 13 to 21.

Figure 39:
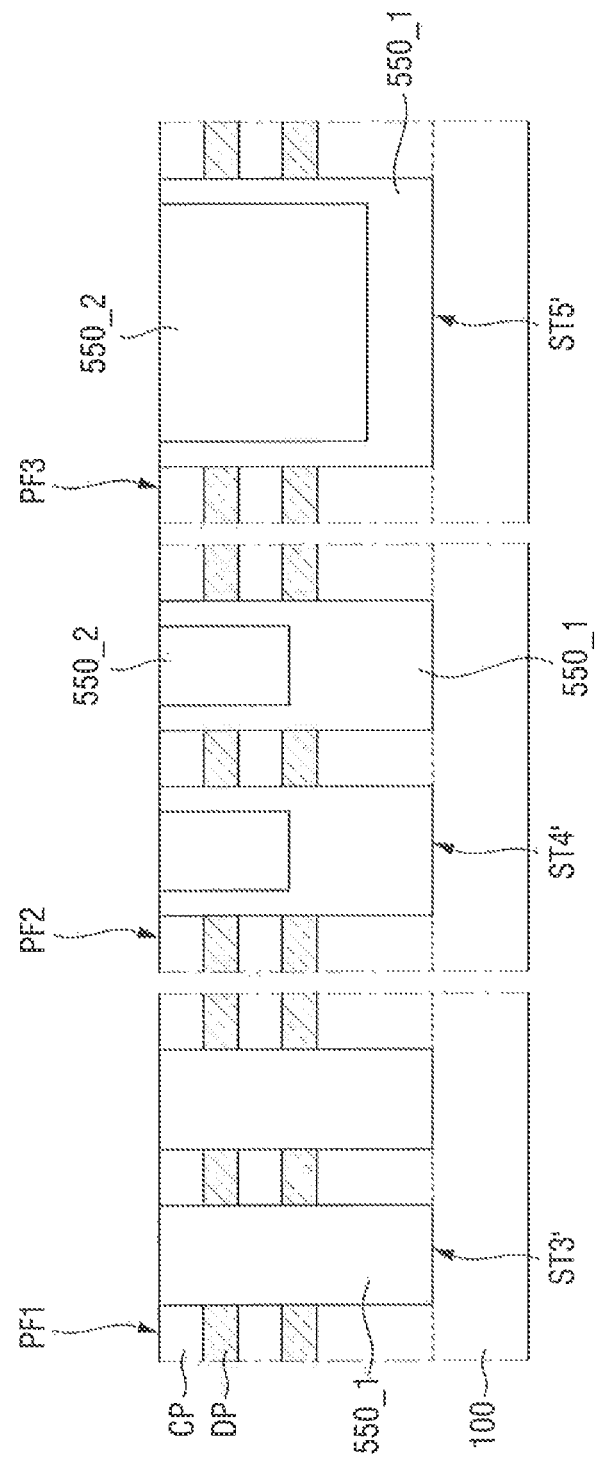

Referring to FIG. 39, the upper surfaces of the first to third pre-patterns PF1, PF2 and PF3 may be exposed, by removing the first and second pre-field insulating films 550_1 and 550_2 disposed on the upper surfaces of the first to third pre-patterns PF1, PF2 and PF3.

Figure 40:
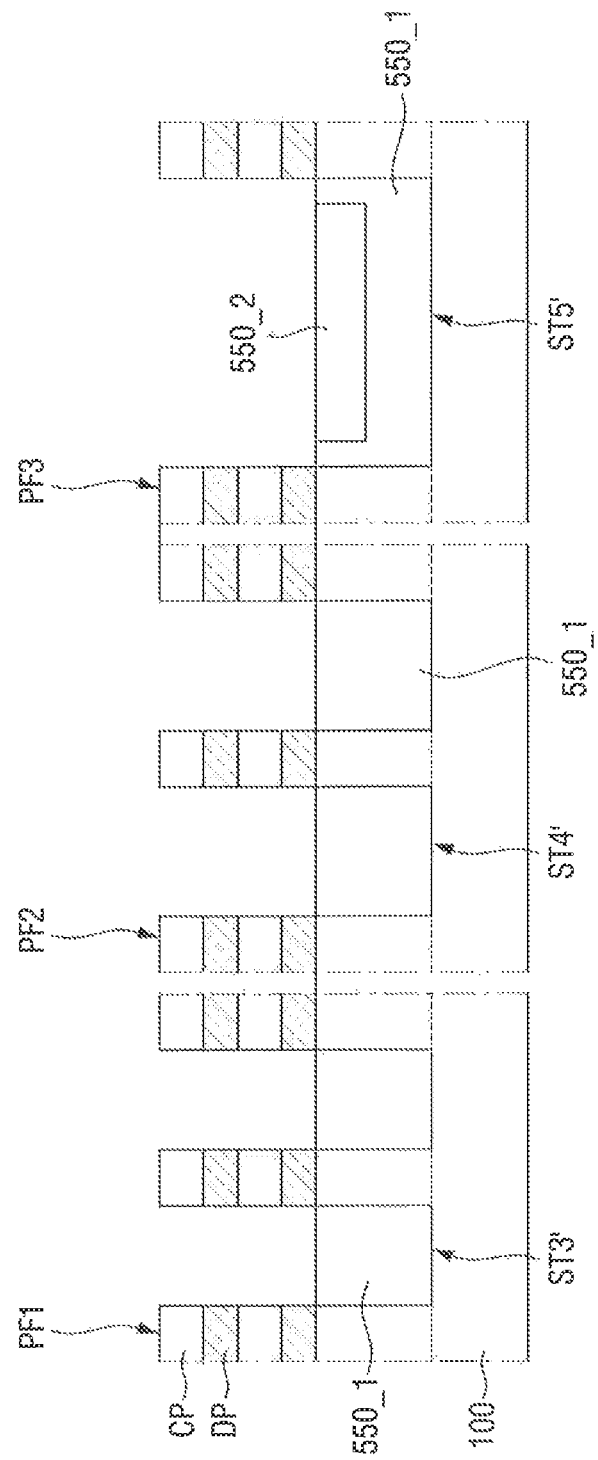

Referring to FIG. 40, the first and second pre-field insulating films 550_1 and 550_2 may be partially removed in the third to fifth shallow trenches ST3', ST4' and ST5'.

Although it is illustrated that the second pre-field insulating film 550_2 does not remain in the fourth shallow trench ST4', exemplary embodiments of the present inventive concept are not limited thereto. For example, whether the second pre-field insulating film 550_2 remains may vary depending on the degree of the recess of the first and second pre-field insulating films 550_1 and 550_2. Subsequently, the dummy pattern DP may be removed.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:
1. A semiconductor device, comprising:
a substrate;
a first fin;
a second fin,
wherein the first and second fins are spaced apart from each other in a first direction on the substrate and extend in a second direction intersecting the first direction;
a first shallow trench formed between the first and second fins;
a field insulating film which fills a first part of the first shallow trench and exposes a second part of the first shallow trench; and
a gate structure on an upper surface of the field insulating film and a part of upper surfaces and side surfaces of the first and second fins, and extending in the first direction,
wherein the gate structure includes a gate electrode and a gate insulating film,
wherein the upper surface of the field insulating film is in a shape of a brace recessed toward the substrate, and has a first point and a second point,
wherein a height from an upper surface of the substrate to the upper surface of the field insulating film is smallest at the first point,
wherein a thickness of the gate insulating film on the first point is different from at least one of a thickness of the gate insulating film on the second point and a thickness of the gate insulating film on the part of the upper surfaces and the side surfaces of the first and second fins, and
wherein a distance from the first point to the first fin in the first direction is different from a distance from the first point to the second fin in the first direction.
2. The semiconductor device of claim 1, wherein the thickness of the gate insulating film on the first point is greater than the thickness of the gate insulating film on the second point and the thickness of the gate insulating film on the part of the upper surfaces and the side surfaces of the first and second fins.

3. The semiconductor device of claim 1, wherein the field insulating film comprises a first portion, a second portion adjacent to the first portion, and a third portion adjacent to the second portion and adjacent to a side wall of the first shallow trench, and
wherein a height from the upper surface of the substrate to the third portion is greater than a height from the upper surface of the substrate to the second portion.

4. The semiconductor device of claim 1, further comprising:
a segregation layer formed on both side walls and upper surfaces of the first and second fins and a lower surface of the first shallow trench.

5. The semiconductor device of claim 1, wherein at least a part of a lower surface of the field insulating film is in a shape recessed toward the upper surface of the field insulating film.

6. A semiconductor device, comprising:
a substrate;
a first shallow trench disposed in a first region of the substrate;
a first lower pattern disposed in the first region of the substrate and extending in a first direction;
a second lower pattern disposed in the first region of the substrate and extending in the first direction,
wherein the first and second lower patterns are separated by the first shallow trench, and the first shallow trench has a first width in a second direction;
a first field insulating film which fills at least a part of the first shallow trench; and
a gate structure on an upper surface of the first field insulating film and a part of upper surfaces and side surfaces of the first lower pattern and the second lower pattern, and extending in the first direction,
wherein the gate structure includes a gate electrode and a gate insulating film,
wherein the upper surface of the first field insulating film comprises a first portion adjacent to the first lower pattern, and a second portion adjacent to the second lower pattern, and has a first point and a second point,
wherein a slope of the first portion of the upper surface of the first field insulating film decreases as it extends away from the first lower pattern,
wherein a slope of the second portion of the upper surface of the first field insulating film decreases as it extends away from the second lower pattern,
wherein a height from an upper surface of the substrate to the upper surface of the field insulating film is smallest at the first point, and
wherein a thickness of the gate insulating film on the first point is greater than a thickness of the gate insulating film on the second point and a thickness of the gate insulating film on the part of the upper surfaces and the side surfaces of the first and second lower patterns.

7. The semiconductor device of claim 6, wherein the upper surface of the first field insulating film has a brace shape indented toward the substrate.

8. The semiconductor device of claim 6, wherein the first portion has the first point.

9. The semiconductor device of claim 6, further comprising:
a plurality of first upper patterns spaced apart from the first lower pattern, and
a plurality of second upper patterns spaced apart from the second lower pattern,
wherein the gate structure wraps around each first upper patterns and second upper patterns.

10. The semiconductor device of claim 6, further comprising:
a second shallow trench disposed in a second region of the substrate;
a third lower pattern disposed in the second region of the substrate and extending in a third direction;
a fourth lower pattern disposed in the second region of the substrate and extending in the third direction; and
a second field insulating film which fills at least a part of the second shallow trench,
wherein the third and fourth lower patterns are separated by the second shallow trench, and the second shallow trench has a second width in a fourth direction which is greater than the first width;
wherein an upper surface of the second field insulating film comprises a third portion, and a fourth portion and a fifth portion disposed on both sides of the third portion,
wherein a slope of the third portion of the upper surface of the second field insulating film is constant,
wherein a slope of the fourth portion of the upper surface of the second field insulating film decreases as it extends away from the third lower pattern, and
wherein a slope of the fifth portion of the upper surface of the second field insulating film decreases as it extends away from the fourth lower pattern.

11. The semiconductor device of claim 10, wherein the second field insulating film comprises at least one or more separation layers disposed in the second field insulating film and extending alongside an upper surface of the substrate.

12. The semiconductor device of claim 11, wherein the separation layers comprise a portion extending along a side wall of the third lower pattern and a side wall of the fourth lower pattern.

13. The semiconductor device of claim 11, wherein the separation layers are separated from each other.

14. The semiconductor device of claim 11, wherein the separation layers comprise nitrogen (N).

15. The semiconductor device of claim 10, further comprising:
a third shallow trench disposed in a third region of the substrate;
a fifth lower pattern disposed in the third region of the substrate and extending in a fifth direction;
a sixth lower pattern disposed in the third region of the substrate and extending in the fifth direction; and
a third field insulating film which fills at least a part of the third shallow trench,
wherein the fifth and sixth lower patterns are separated by the third shallow trench, and the third shallow trench has a third width in a sixth direction which is smaller than the first width and the second width,
wherein an upper surface of the third field insulating film comprises a sixth portion adjacent to the fifth lower pattern, and a seventh portion adjacent to the sixth lower pattern,
wherein the sixth portion of the upper surface of the third field insulating film is in contact with the seventh portion of the upper surface of the third field insulating film,
wherein a slope of the sixth portion of the upper surface of the third field insulating film decreases as it extends away from the fifth lower pattern, and wherein a slope of the seventh portion of the upper surface of the third field insulating film decreases as it extends away from the sixth lower pattern.

16. A semiconductor device, comprising:
a substrate;
a first shallow trench disposed in a first region of the substrate;
a first lower pattern disposed in the first region of the substrate and extending in a first direction;
a second lower pattern disposed in the first region of the substrate and extending in the first direction,
wherein the first and second lower patterns are separated by the first shallow trench, and the first shallow trench has a first width in a second direction;
a second shallow trench disposed in a second region of the substrate;
a third lower pattern disposed in the second region of the substrate and extending in a third direction;
a fourth lower pattern disposed in the second region of the substrate and extending in the third direction,
wherein the third and fourth lower patterns are separated by the second shallow trench, and the second shallow trench has a second width in a fourth direction which is greater than the first width;
a first field insulating film which fills at least a part of the first shallow trench; and
a second field insulating film which fills at least a part of the second shallow trench;
wherein an upper surface of the first field insulating film comprises a first portion adjacent to the first lower pattern, and a second portion adjacent to the second lower pattern,
wherein a slope of the first portion of the upper surface of the first field insulating film decreases as it extends away from the first lower pattern,
wherein a slope of the second portion of the upper surface of the first field insulating film decreases as it extends away from the second lower pattern,
wherein an upper surface of the second field insulating film comprises a third portion, and a fourth portion and a fifth portion disposed on both sides of the third portion,
wherein a slope of the third portion of the upper surface of the second field insulating film is constant,
wherein a slope of the fourth portion of the upper surface of the second field insulating film decreases as it extends away from the third lower pattern, and
wherein a slope of the fifth portion of the upper surface of the second field insulating film decreases as it extends away from the fourth lower pattern.

17. The semiconductor device of claim 16, wherein the first portion of the upper surface of the first field insulating film is in contact with the second portion of the upper surface of the first field insulating film.

18. The semiconductor device of claim 16, wherein the upper surface of the first field insulating film has a brace shape indented toward the substrate.

* * * * *